United States Patent
Kurokawa et al.

(10) Patent No.: US 8,189,329 B2
(45) Date of Patent: May 29, 2012

(54) STORAGE CONTROL APPARATUS

(75) Inventors: Midori Kurokawa, Odawara (JP);
Akihiro Inamura, Hadano (JP);
Tsuyoshi Sasagawa, Odawara (JP);
Takahiko Iwasaki, Hadano (JP); Toru Yoneyama, Hadano (JP); Minoru Shimokawa, Odawara (JP); Kiyoshi Honda, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 703 days.

(21) Appl. No.: 12/354,006

(22) Filed: Jan. 15, 2009

(65) Prior Publication Data

US 2010/0118483 A1    May 13, 2010

(30) Foreign Application Priority Data

Nov. 12, 2008    (JP) .................. 2008-290065

(51) Int. Cl.
    *G06F 1/16*    (2006.01)
(52) U.S. Cl. ................ 361/679.33; 439/630; 435/320.1; 455/74.1
(58) Field of Classification Search .............. 439/630, 439/60, 160, 325; 361/679.51, 756, 679.41, 361/679.02, 679.49, 679.27, 679.55, 679.31, 361/679.48; 435/379, 285.1, 91.2, 124, 91.41, 435/320.1; 455/66.1, 41.2, 550.1, 575.1, 455/74.1, 73; 312/223.3, 249.9, 107.5, 196
See application file for complete search history.

(56) References Cited

U.S. PATENT DOCUMENTS

| 7,269,006 | B2 * | 9/2007 | Miyamoto et al. ....... 361/679.48 |
| 7,558,058 | B2 | 7/2009 | Hidaka |
| 7,586,745 | B1 * | 9/2009 | Szelong et al. ............. 361/695 |
| 2007/0002847 | A1 | 1/2007 | Inamura et al. |

FOREIGN PATENT DOCUMENTS

| JP | 2006-294201 | 10/2006 |
| JP | 2007-011682 | 1/2007 |

OTHER PUBLICATIONS

Office Action issued in Japanese Patent Application No. 2008-290065 on Oct. 29, 2010.

* cited by examiner

*Primary Examiner* — Hung Duong
(74) *Attorney, Agent, or Firm* — Antonelli, Terry, Stout & Kraus, LLP.

(57) ABSTRACT

A storage unit is provided with a plurality of sub storage units configured to include a plurality of hard disk drives, an enclosure, a printed wiring board, a power supply device, and a cable holder. The sub storage units each operate separately. The enclosure is provided in the array of hard disk drives so that the distance can be shorter between the enclosure and each of the hard disk drives. With the provision cable holder, communications cables can be both brought closer to the printed wiring board. With such a configuration, the coupling point among the communications cables and the printed wiring board, and the enclosure can be favorably reduced. The resulting storage control apparatus of the invention can be mounted with a larger number of storage devices, thereby being able to keep the signal quality.

16 Claims, 21 Drawing Sheets

FIG. 17

| | | | | | |T10

STORAGE UNIT MANAGEMENT TABLE

| C10 | C11 | C12 | C13 | C14 | C15 |
|---|---|---|---|---|---|
| UNIT # | SAS ADDRESS | MANUFACTURING NUMBER | PAIRED # | SUB STORAGE UNIT TYPE | EFFECTIVE FLAG |
| 0 | Adr0 | 8000000001 | 0 | L | OK |
| 1 | Adr1 | 8000000001 | 0 | R | OK |
| 2 | Adr2 | 3000000001 | – | – | OK |
| 3 | Adr3 | 8000000002 | 1 | L | OK |
| 4 | Adr4 | 8000000002 | 1 | R | OK |

STORAGE CONTROL APPARATUS

CROSS REFERENCES TO RELATED APPLICATIONS

This application relates to and claims priority from Japanese Patent Application No. 2008-290065, filed on Nov. 12, 2008, the entire disclosure of which is incorporated herein by reference.

BACKGROUND OF THE INVENTION

The present invention relates to a storage control apparatus.

DESCRIPTION OF THE RELATED ART

A storage control apparatus provides a host computer (hereinafter, "host") with a storage area of a relatively large capacity. The storage control apparatus implements the storage area based on RAID (Redundant Array of Independent Disks) using a plurality of hard disk drives, for example. Any physical storage area of each of the hard disk drives is formed thereon with a logical volume being a logical storage area. The host can perform data reading/writing from/to such logical volumes.

Patent Document 1 (JP-A-2007-011682) describes a known storage control apparatus in which daisy chain connection is established between a basic chassis having a control function, and an expanded chassis having a storage function. The basic chassis is mounted with a controller and a plurality of hard disk drives, and the expanded chassis is mounted with a plurality of hard disk drives.

SUMMARY OF THE INVENTION

In such a previous storage control apparatus, a user can increase the storage capacity of the storage control apparatus by an addition of any expanded chassis as appropriate. The problem here is that the larger number of the expanded chassises will increase the size of the storage control apparatus. Moreover, when the number of the storage devices is increased in each of the expanded chassises, the distance is increased between a unit control device being in charge of communications with a control device and the storage devices, thereby possibly deteriorating the signal quality.

The invention is proposed in consideration of such problems, and an object thereof is to provide a storage control apparatus that can provide a larger storage capacity, and can keep the signal quality of a predetermined level without increasing the placement size of the resulting apparatus. Other objects of the invention will become more apparent from the following detailed description of the present invention.

In order to achieve the object above, an aspect of the invention is directed to a storage control apparatus that includes: a control device; and a storage unit to be controlled by the control device. In the storage control apparatus, the storage unit includes: a chassis; and a plurality of sub storage units that are provided in the chassis, and operate each independently. The sub storage units each include: a print wiring board; a plurality of storage devices to be attached to the printed wiring board; at least one or more unit control devices provided at a predetermined position(s) between the storage devices for taking charge of communications between the storage devices and the control device; at least one or more power supply devices attached to the printed wiring board for making a power supply to each of the plurality of storage devices and the at least one or more unit control devices; and at least one or more cable attachment devices each detachably attached to the printed wiring board with a communication cable detachably attached thereto for a coupling between the control device and the at least one or more unit control devices.

The predetermined position(s) are each set to have a first distance of a predetermined first upper limit value or smaller for between the at least one or more unit control devices and each of the plurality of storage devices, and a second distance of a predetermined second upper limit value or smaller for between the at least one or more unit control devices and the one or more cable attachment devices.

The at least one or more unit control devices are provided plurally on the printed wiring board, and at least one or more of the plurality of storage devices are provided each between the unit control devices.

The at least one or more cable attachment devices are each inserted to be parallel to the printed wiring board from a space between the at least one or more power supply devices and the chassis, and are each electrically coupled to the printed wiring board.

The at least one or more cable attachment devices each include: a body that accommodates at least a part of the communications cable; an electrical coupling device provided at one end side of the body for establishing an electrical coupling between the printed wiring board and one end side of the communications cable; and a positioning coupling device provided to the one end side of the body for positioning through mechanical coupling with the printed wiring board.

The electrical coupling device includes: a first connector to which the one end side of the communications cable is electrically coupled; a second connector to be electrically coupled to the printed wiring board; and a wiring device for establishing an electrical coupling between the first and second connectors.

The at least one or more cable attachment devices are each provided with: an input cable attachment device to be attached with an input communications cable for transmission of a signal provided to the at least one or more unit control devices; and an output cable attachment device to be attached with an output communications cable for transmission of a signal provided by at least the one or more unit control devices.

The plurality of storage devices and the at least one or more unit control devices are detachably provided to be vertical to the printed wiring board, the at least one or more power supply devices are detachably provided to be parallel to the printed wiring board via a first attachment board provided vertically to the printed wiring board, and the cable attachment device may be located at a space between the at least one or more power supply devices and the printed wiring board, and is detachably provided to be parallel to the printed wiring board.

One surface of the printed wiring board is provided thereon with a plurality of rows of the plurality of storage devices aligned in a first direction with a space in a second direction orthogonal to the first direction, and the one or more unit control devices may be provided to across any plurality of the rows on a side closer to the printed wiring board in the second direction, and the plurality of the storage devices may be provided between a plurality of the at least one or more unit control devices.

The first and second upper limit values are set to achieve signal transmission with a predetermined level of quality without using a device for signal relay.

BRIEF DESCRIPTION OF THE DRAWINGS

FIG. 17 is a diagram illustrating a table for management use of the storage units;

DESCRIPTION OF THE PREFERRED EMBODIMENT

Figure 1:
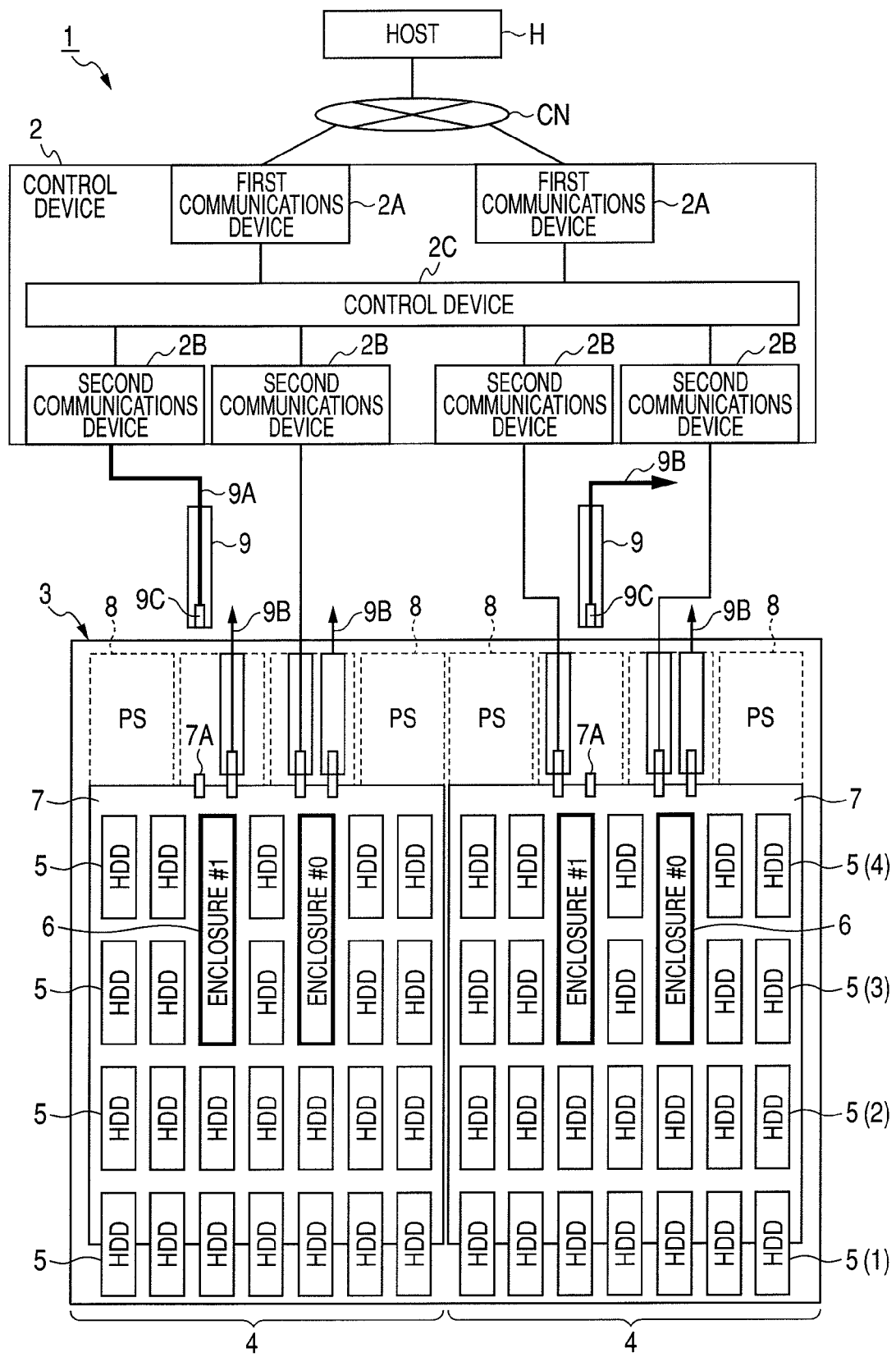
FIG. 1 is a diagram showing the overview of an embodiment of the invention.

In the below, by referring to the accompanying drawings, an embodiment of the invention is described. FIG. 1 is a diagram showing the overview of the embodiment. The more detailed configuration thereof will become more apparent from the following detailed description. In this embodiment, a storage unit 3 is provided therein with a plurality of sub storage units 4. The storage unit 3 is used as a unit of attachment to a rack (not shown) and detachment therefrom. The sub storage unit 4 is used as a unit of coupling with a control device 2. That is, the sub storage units 4 can be used each independently.

Moreover, in the embodiment, as will be described later, a plurality of hard disk drives 5 are provided each vertically to a printed wiring board 7, and in the array of such hard disk drives 5, enclosures 6 are disposed. This configuration of this embodiment allows mounting of a larger number of the hard disk drives 5 on the printed wiring board 7, and enables suppression of any possible degradation of the signal quality. This is because, in this embodiment, with the enclosures 6 disposed at their predetermined positions in the array of the hard disk drives 5 as such, a signal line between the enclosure 6 and the hard disk drive 5 can always have a first distance of a predetermined first upper limit value or smaller, and a signal line between the enclosure 6 and a coupling portion between cables 9A and 9B can always have a second distance of a predetermined second upper limit value or smaller.

The storage control apparatus 1 of FIG. 1 is configured to include the control device 2, and at least one or more storage units 3. The storage unit 3 can be provided plurally to the rack (refer to FIG. 2), but FIG. 1 shows only one storage unit 3 in this example for convenience.

The control device 2 serves to control the operation of the storage control apparatus 1, and is configured to include a first communications device 2A, a second communications device 2B, and a control device 2C. The first communications device 2A is a communications control circuit for communications with a host H. The first communications device 2A communicates with the host H via the communications protocol such as FCP (Fibre Channel Protocol), iSCSI (Internet Small Computer System Interface), and others.

The second communications device 2B is a communications control circuit for communications with the hard disk drives 5 in each of the storage units 3. The second communications device 2B is coupled to each of the sub storage units 4 in the storage unit 3 via the cables 9A and 9B each exemplified by a fiber-optic cable or others. The cable 9A is an input cable for signal input to the sub storage units 4, and the cable 9B is an output cable for signal extraction from the sub storage units 4.

The control device 2C controls the operation of the control device 2. The control device 2C controls communications between the host H and the hard disk drives 5 in the sub storage units 4 using a table for management use of the storage units 3 (refer to FIG. 17).

The storage unit 3 is provided therein with a plurality of, e.g., two, sub storage units 4. The storage unit 3 including a plurality of sub storage units 4 as such can be referred to as high-density storage unit. On the other hand, a storage unit including no sub storage unit 4 is referred to as normal storage unit. Although not shown in FIG. 1, as will be described later, the high-density storage unit 3 can be used together with the normal storage unit (refer to FIG. 19).

The sub storage units 4 are each configured to include the hard disk drives 5, the enclosures 6, the printed wiring board 7, a power supply device 8, and a cable holder 9, for example.

The hard disk drives 5 each serving as a "storage device" are coupled to the second communications device 2B via the enclosures 6 and the cable 9A. The hard disk drives 5 can be each exemplified by an FC (Fibre Channel) disk, an SCSI (Small Computer System Interface) disk, an SATA disk (Serial ATA) disk, an ATA (At Attachment) disk, a SAS (Serial Attached SCSI) disk, and others. As an alternative to the hard disk drive, possibly used is any data readable/writable device such as semiconductor memory device, optical disk device, magneto-optical disk device, or magnetic tape device. The semiconductor memory device is exemplified by a flash memory, a FeRAM (Ferroelectric Random Access Memory), a MRAM (Magnetoresistive Random Access Memory), an Ovonic Unified Memory, a RRAM (Resistance RAM), and others.

The enclosures 6 each serving as a "unit control device" controls the operation of the sub storage units 4. The enclosures 6 are respectively coupled to the hard disk drives 5 in the sub storage units 4. In other words, the hard disk drives 5 in the sub storage units 4 are respectively coupled to the enclosures 6 also in the sub storage units 4. Accordingly, even if failures occur in any one of the enclosures 6, the hard disk drives 5 can be accessed from the remaining enclosure(s) 6.

The printed wiring board 7 is provided to each of the sub storage units 4. The printed wiring board 7 is provided with a connector for establishing an electrical coupling with the hard disk drives 5 and the enclosures 6 (refer to FIG. 10). The hard disk drives 5 and the enclosures 6 are each provided vertically to the printed wiring board 7.

Described now is a method for placing the hard disk drives 5. In this embodiment, on one surface of the printed wiring board 7, a plurality of hard disk drives 5 are disposed in a matrix in a plan view. In FIG. 1 example, the printed wiring boards 7 are each provided thereon with the arrays of the hard disk drives in four rows in total. As shown in the right portion of FIG. 1, numerical subscripts in parentheses of (1) to (4) with the hard disk drives 5 respectively denote the four rows.

The first row located at the lower portion of FIG. 1 is configured by the seven hard disk drives 5 in total. The seven hard disk drives 5 are disposed in the lateral direction of FIG. 1, i.e., corresponds to the first direction, with a space each therebetween.

The second row located above the first row is also configured by the seven hard disk drives 5, and are disposed in the lateral direction with a space each therebetween. The hard disk drives 5 in the first row and the hard disk drives 5 in the second row are disposed with a space each therebetween in the vertical direction of FIG. 1, i.e., corresponds to the second direction.

The third row located above the second row and the fourth row located above the third row are each configured by the five hard disk drives 5. The enclosures 6 are disposed on the printed wiring board 7 in such a manner as to lay across the third and fourth rows. The hard disk drives in the third row and those in the fourth row are thus fewer in number by two than those in the first and second rows.

Between the enclosures 6 on the right and left sides, the hard disk drives 5 are disposed in the vertical direction. With the hard disk drives 5 disposed between the enclosures 6 on the right and left sides as such, the flexibility of the printed wiring pattern can be increased on the printed wiring board 7. This accordingly enables to form, with relative ease, the printed wiring pattern extending from the enclosures 6 to the hard disk drives 5.

The power supply device 8 makes a supply of predetermined power to each of the hard disk drives 5, and the enclosures 6. The power supply device 8 is provided two each to each of the sub storage units 4, and thus even if one of the two power supply devices 8 becomes out of order, the remaining power supply device 8 can operate the sub storage unit 4.

The power supply device 8 is attached to one side portion of the printed wiring board 7, i.e., the upper side portion in FIG. 1, to be parallel to the printed wiring board 7 with a different height via an attachment board that is not shown. Between the bottom surface of the power supply device 8 and the chassis of the storage unit 3, there is a space formed for detachable attachment of the cable holder 9 (refer to FIG. 7).

The cable holder 9 serving as the "cable attachment device" is provided for electrically coupling the communications cables 9A and 9B to the printed wiring board 7. The cable holder 9 is provided to each of the input and output communications cables 9A and 9B.

The enclosures 6 are coupled with both the input and output communications cables 9A and 9B. The sub storage units 4 are thus each attached with two of the input communications cable 9A and two of the output communications cable 9B, i.e., four communications cables in total. It means that the storage unit 3 is attached with eight communications cables in its entirety. Accordingly, eight of the cable holders 9 are also provided to the storage unit 3 in its entirety.

The reason for providing the cable holders separately for input use and output use is to enable individual insertion and removal of the input and output communications cables 9A and 9B. This favorably increases the workability for the maintenance services.

One end side of the cable holder 9, i.e., lower side of FIG. 1, is provided with a connector 9C serving as the "electrical coupling device". The connector 9C corresponds to a connector 7A provided to the other end side of the printed wiring board 7.

A user attaches the communications cable 9A to the cable holder 9 for input use, and the communications cable 9B to the cable holder 9 for output use. The user then inserts the cable holders 9 respectively attached with the communications cables 9A and 9B into the spaces between the bottom surface of the power supply device 8 and the chassis of the storage unit 3, thereby electrically coupling the connector 9C to the connector 7A. This accordingly couples the control device 2 to the enclosures 6 via the communications cables 9A and 9B, and the printed wiring pattern of the printed wiring board 7. The control device 2 is also coupled to each of the hard disk drives 5 via the enclosures 6.

The enclosures 6 disposed in the array of the hard disk drives 5 are consequently located substantially at the center portion of the sub storage unit 4. This resultantly increases the distance between the communications cables 9A and 9B attached from the outside of the storage unit 3 and the enclosures 6, thereby causing a difficulty in the attachment/detachment operation of the communications cables 9A and 9B. With the distance increased as such between the communications cables 9A and 9B and the enclosures 6, there is a possibility of reducing the quality of signals to be exchanged between the communications cables 9A and 9B and the enclosures 6. In consideration thereof, in this embodiment, the tip ends of the communications cables 9A and 9B are brought closer to the enclosures 6 by using the cable holder 9, which extends below the power supply device 8 toward the printed wiring board 7. This accordingly enables to relatively reduce the distance between the tip ends of the communications cables 9A and 9B and the enclosures 6, thereby being able not to reduce the signal quality.

As described above, in this embodiment, even if with a relatively large number of the hard disk drives 5, there is no more need to use any special circuit for relaying signals to keep the quality of the signals to be exchanged between the enclosures 6 and the hard disk drives 5, and the quality of the signals to be exchanged between the enclosures 6 and the communications cables 9A and 9B. With no more need to use a special circuit as such, the manufacturing cost can be favorably cut. What is better, using a larger number of components often increases the possibility of failure, and thus the reliability is resultantly reduced. However, in the embodiment that can keep the signal quality without using any special circuit, the reliability can be successfully increased.

In the storage control apparatus 1 configured as such, one high-density storage unit 3 is provided therein with a plurality of sub storage units 4 so that a larger number of the hard disk drives 5 can be mounted.

The sub storage units 4 are each provided, for its own, with the hard disk drives 5, the enclosures 6, the power supply device 8, and others, and each operate independently. The control device 2 is allowed to handle the sub storage units 4 each as an independent storage unit, and data exchange is allowed among the sub storage units 4. As such, with no need to substantially modify a computer program in the control device 2, the high-density storage unit 3 becomes available for use.

In this embodiment, the enclosures 6 are disposed in the array of the hard disk drives. With such a layout, compared with a layout in which the enclosures 6 are completely isolated from the hard disk drives 5, the distance therebetween can be shorter. As such, even if the hard disk drives are provided at high densities, the signal quality can remain the same between the hard disk drives 5 and the enclosures 6. In the below, by referring to FIG. 2 and others, the embodiment is described in more detail.

First Example

By referring to FIGS. 2 to 21, an example is described. As to the correlation with FIG. 1, a storage control apparatus corresponds to the storage control apparatus 1 of FIG. 1, a control unit 20 to the control device 2 of FIG. 1, a storage unit 40 to the storage unit 3 of FIG. 1, a sub storage unit 50 to the sub storage unit 4 of FIG. 1, and a hard disk drive to the hard disk drive 5 of FIG. 1. A protocol chip 31 corresponds to the first communications device 2A of FIG. 1, a SAS protocol chip 32 to the second communications device 2B of FIG. 1, and a CPU (Central Processing Unit) 35, a memory 36, and others to the control device 2C of FIG. 1. An enclosure corresponds to the enclosure 6 of FIG. 1, a power supply device 55 to the power supply device 8 of FIG. 1, a host 60 to the host H of FIG. 1, and a communications network CN10 to a communications network CN of FIG. 1. Cable holders 54A and 54B of FIG. 7 both correspond to the cable holder 9 of FIG. 1, connectors 542 and 543 of FIG. 10 to the connector 9C of FIG. 1, a printed wiring board 58 of FIG. 9 to the printed wiring board 7 of FIG. 1, a connector 584 of FIG. 10 to the connector 7A of FIG. 1, and a communications cable 70 of FIG. 15 to the communications cables 9A and 9B of FIG. 1.

Figure 2:
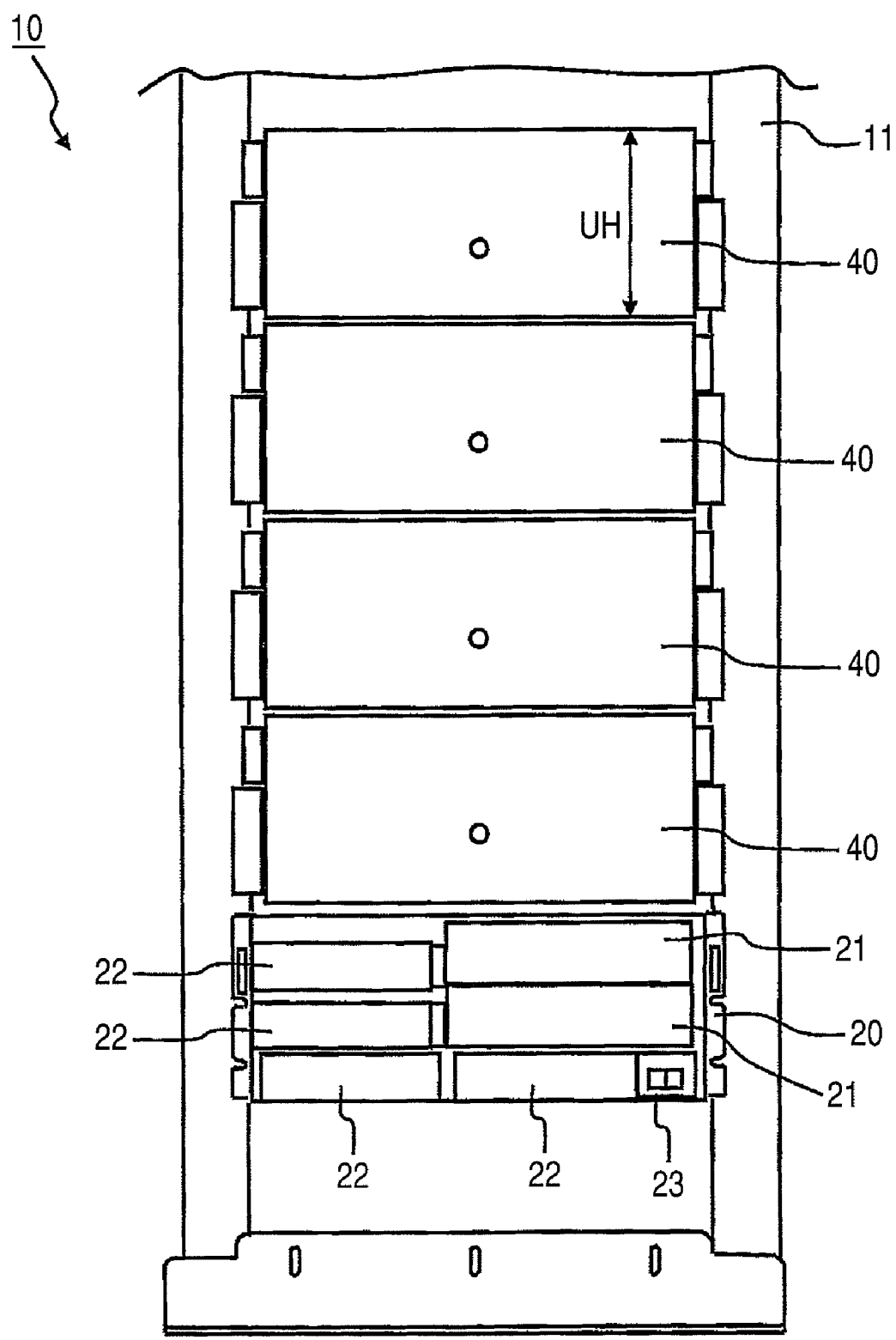
FIG. 2 is a front view of a storage control apparatus viewed from the front.

FIG. 2 is a front view of the storage control apparatus 10. In FIG. 2, a rack 11 exemplarily configured as a 19-inch rack is detachably attached with one control unit 20, and a plurality of storage units 40.

The control unit 20 serves to control the storage control apparatus 10, and is attached to the lower portion of the rack 11, for example. Although the configuration of the control unit 20 will be described later by referring to FIG. 15, briefly by referring to FIG. 2, the control unit 20 is configured to include, in addition to a controller 30 that will be described later, a plurality of cooling fans 21, a plurality of battery devices 22, and a main switch 23. The cooling fans 21 serve to cool the control unit 20. The battery device 22 supplies a battery power to the control unit 20 and each of the storage units 40 at the time of power failure. The main switch 23 is provided for activating the storage control apparatus 10.

On the upper side of the control unit 20, a plurality of storage units 40 are detachably attached to the rack 11. The storage unit 40 is of two types, including a high-density storage unit and a normal storage unit. The high-density storage unit denotes a storage unit including therein a plurality of sub storage units 50, and is under a reference numeral 40D. The normal storage unit denotes a storage unit including no sub storage unit, and is under a reference numeral 40N. When no specific distinction is needed between the high-density storage unit and the normal storage unit, a reference numeral 40 is provided thereto.

The high-density storage unit 40D can be provided with 24 hard disk drives 51 respectively on the right and left sides, i.e., 48 hard disk drives 51 in total, and the height dimension UH thereof is 4 U, for example. The normal storage unit 40N can be provided with about 15 hard disk drives, for example, and the height dimension thereof is 3 U, for example. Herein, 1 U is 44.45 mm (1.77 inches). In the description below, the high-density storage unit 40D is mainly described, which is the characteristics configuration of this example.

Figure 3:
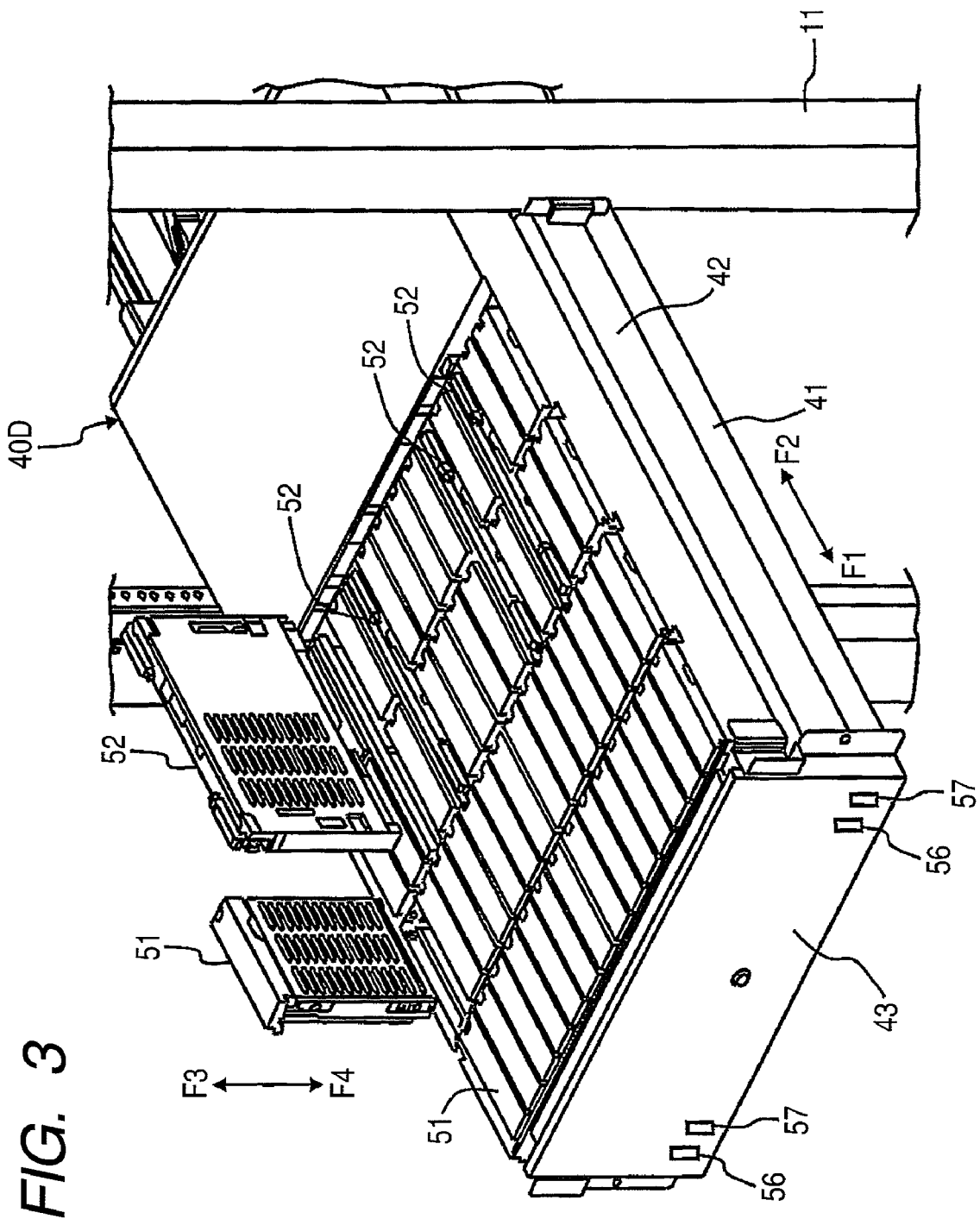
FIG. 3 is an enlarged perspective view of a storage unit.

FIG. 3 is a perspective view of the high-density storage unit 40D. The high-density storage unit 40D is configured to include a box-shaped case 41, a plurality of hard disk drives 51 and a plurality of enclosures 52 detachably disposed in the case 41, and a power supply lamp 56 and a position display lamp 57 that are disposed on a front surface 43 of the case 41, for example. The enclosures 52 and others will be described later.

The case 41 serving as a "chassis" is provided with, respectively on both side surfaces, rails 42. The high-density storage unit 40D is detachably attached to the rack 11 via the rails 42. For exchange of the hard disk drives 51, for example, a user pulls out the case 41 in the direction of an arrow F1, and extracts the hard disk drives 51 or others in the direction of an arrow F3. For attachment of the hard disk drives 51, the user places the hard disk drives 51 or others in the direction of an arrow F4, and pushes the case 41 in the direction of an arrow F2 to put it back into the rack 11.

Figure 4:
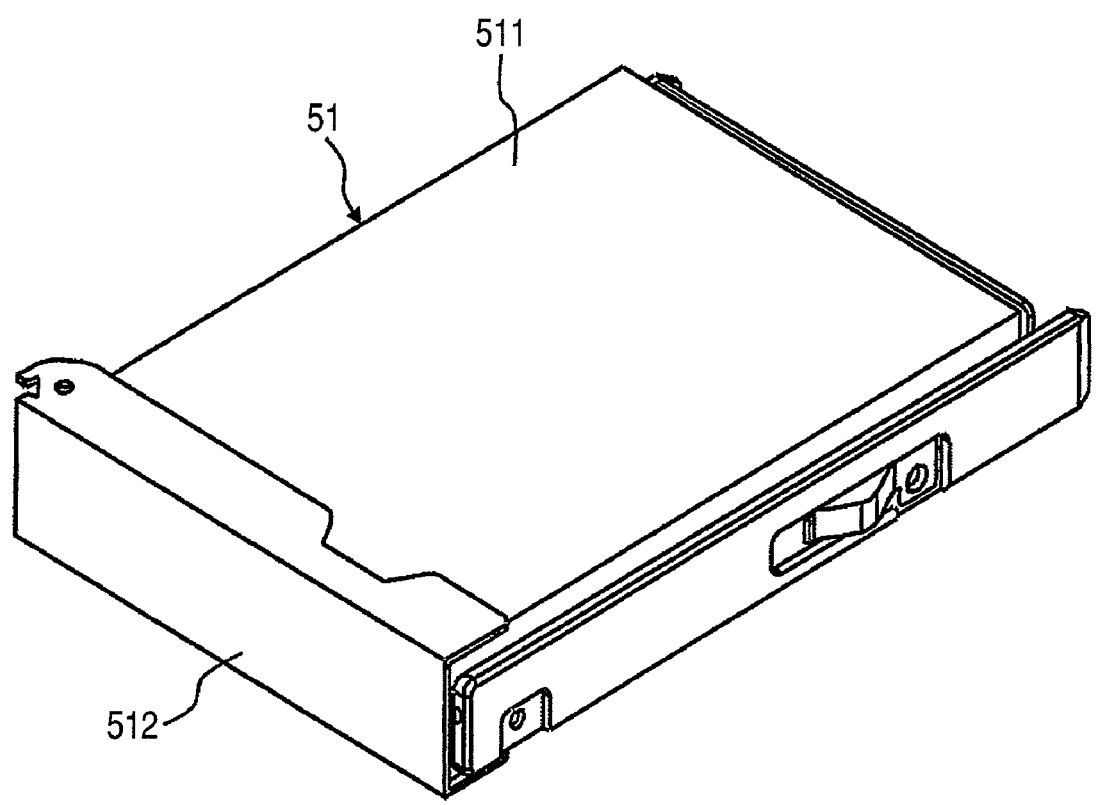
FIG. 4 is an enlarged perspective view of a hard disk drive.

FIG. 4 is an external view of the hard disk drive 51. The hard disk drive 51 is configured to include a drive body 511, and a canister 512 for accommodating therein the drive body 511. The canister 512 is so formed as to cover the surface of the drive body 511 not entirely but only partially.

Figure 5:
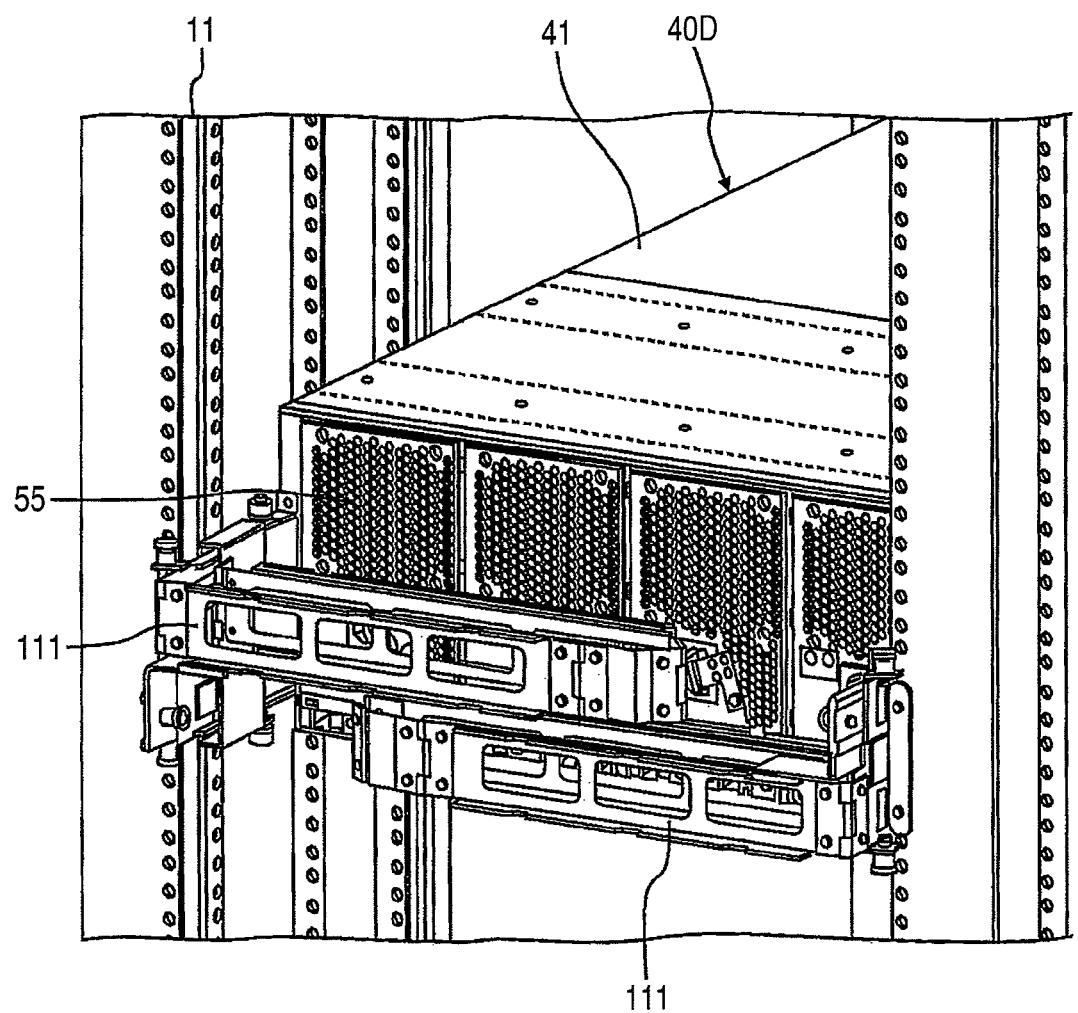
FIG. 5 is a perspective view of a rack to which the storage unit is attached, viewed from the rear.

FIG. 5 is a perspective view of the configuration in which the high-density storage unit 40D is housed in the rack 11 viewed from the rear. The rack 11 is provided with a pantograph member 111. The pantograph member 111 is attached to the rails 42 to be able to move. When the high-density storage unit 40D is completely housed in the rack 11, as shown in FIG. 5, the pantograph member is folded, and is located on the rear surface side of the high-density storage unit 40D.

Figure 6:
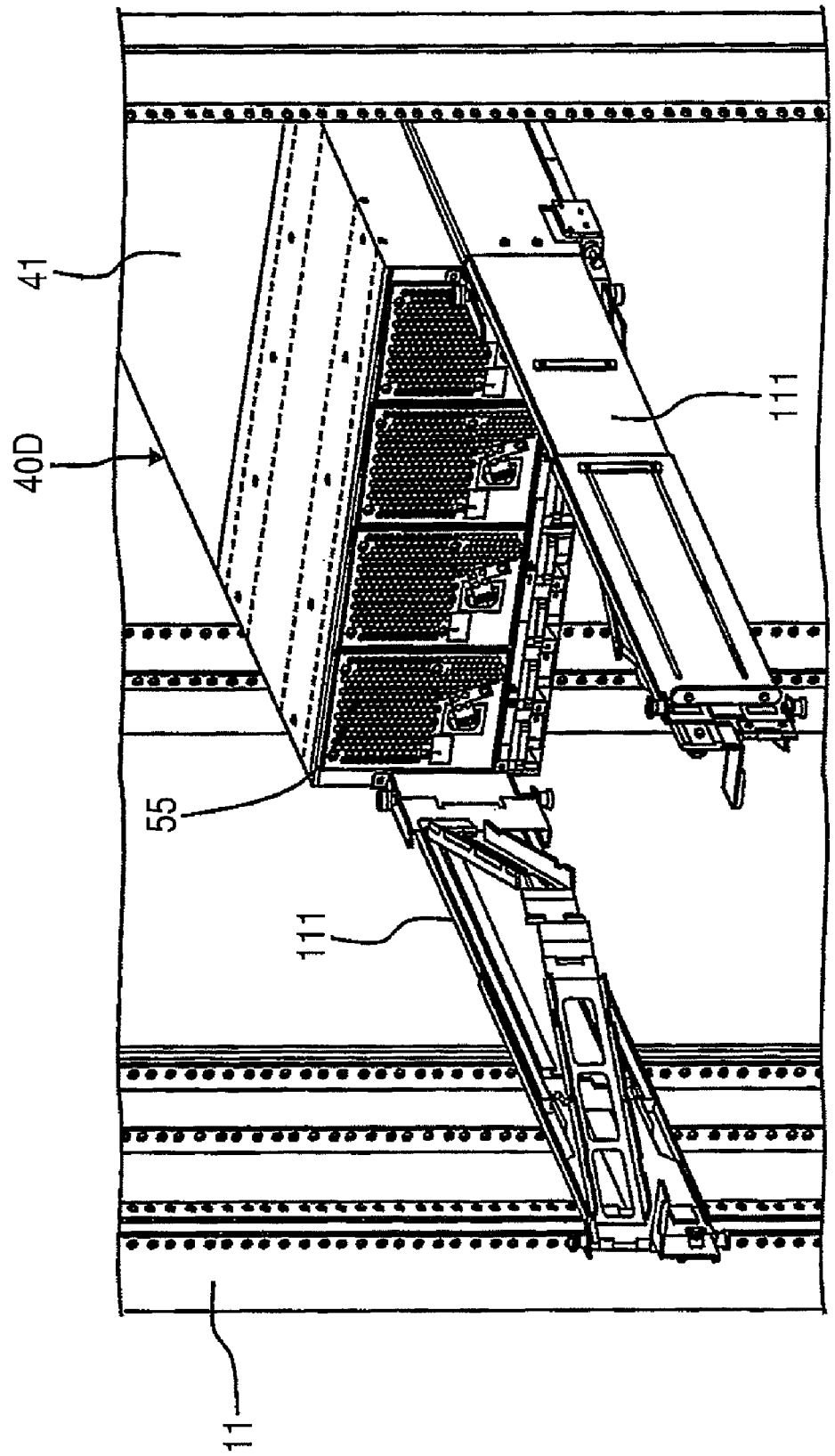
FIG. 6 is a perspective view of the rack from which the storage unit is pulled out, viewed from the rear.

FIG. 6 is a perspective view of the configuration in which the high-density storage unit 40D is pulled to the front surface side of the rack 11 viewed from the rear. In this case, the pantograph member 111 is changed in state, i.e., being folded to be flat, so that the rear surface side of the high-density storage unit 40D is exposed.

Figure 7:
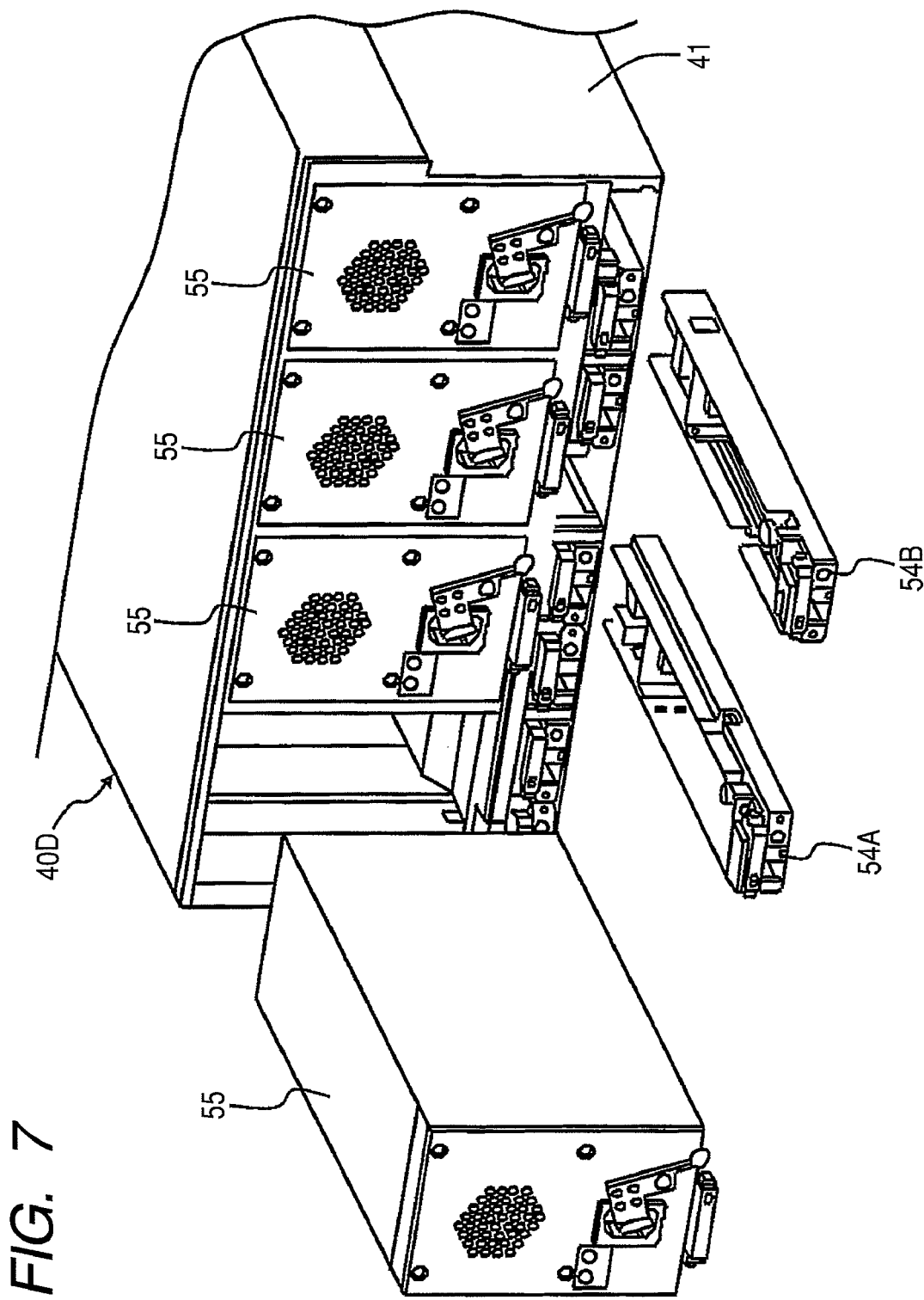
FIG. 7 is a perspective view of the storage unit viewed from the rear.

FIG. 7 is a perspective view of the high-density storage unit 40D viewed from the rear. The high-density storage unit 40D is detachably provided with, on the rear side, a plurality of, e.g., four, power supply devices 55.

The power supply devices 55 are each detachably provided with, on the lower side, cable holders 54A and 54B (hereinafter, referred to as cable holder 54 when no specific distinction therebetween is needed). The cable holder 54 is detachably attached with a cable 70 (refer to FIG. 15). The cable holder 54A for input use is attached with the cable 70 on the signal input side. The cable holder 54B for output use is attached with the cable 70 on the signal output side.

The cable holders 54 are respectively attached with the cables 70, and the cable-attached cable holders 54 are inserted into the spaces between the power supply devices 55 and the case 41, thereby being able to attach the cables 70 to the connectors of the enclosures 52.

Figure 8:
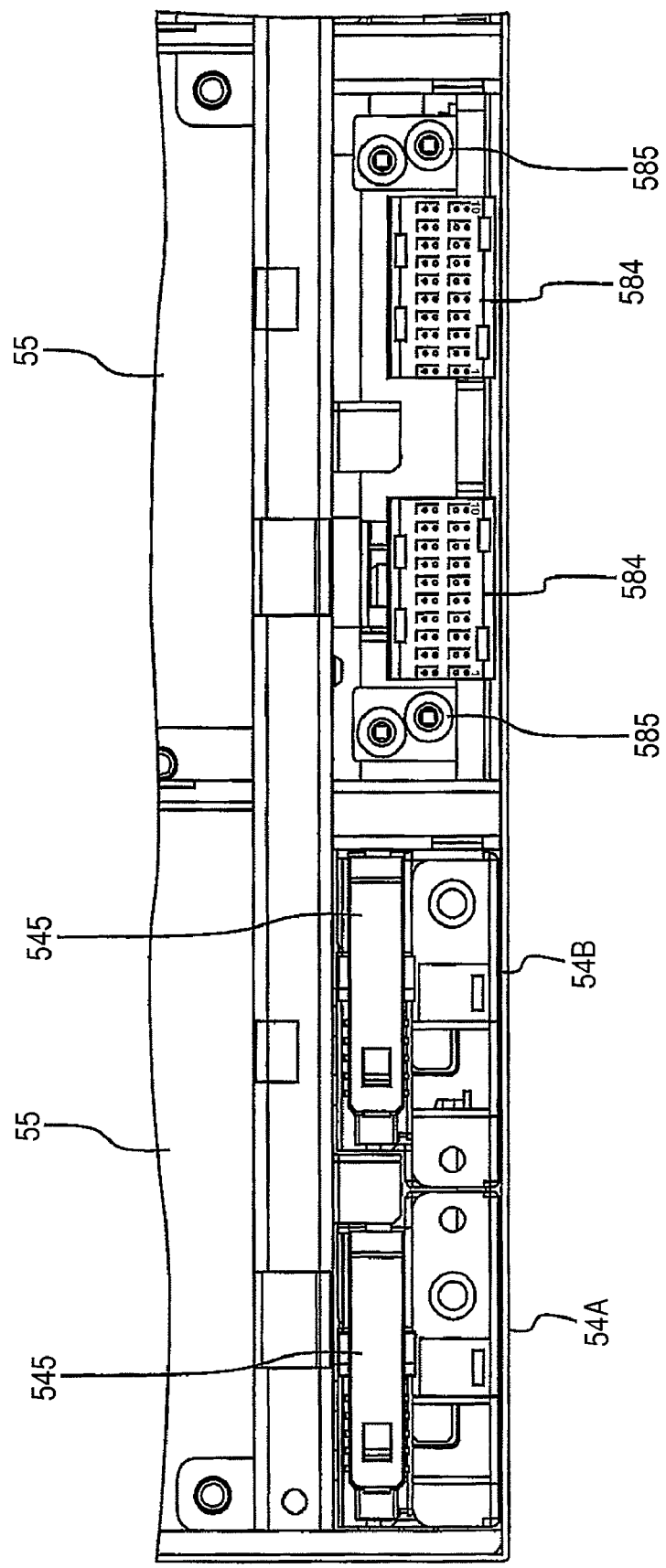
FIG. 8 is a diagram showing an enlarged view of a rear surface and others of a cable holder.

FIG. 8 is an enlarged view of the high-density storage unit 40D on the rear surface side mainly around the cable holders 54A and 54B. On the left side of FIG. 8, the configuration attached with the cable holders 54A and 54B is shown, and on the right side of FIG. 8, the configuration removed with the cable holders 54A and 54B is shown.

As shown in FIG. 8, the cable holders 54A and 54B are each provided with, at the rear end, a lever 545. The user pulls forward the levers 545, and grabs and pulls out the levers 545, thereby being able to pull out the cable holders 54A and 54B from the case 41.

Figure 9:
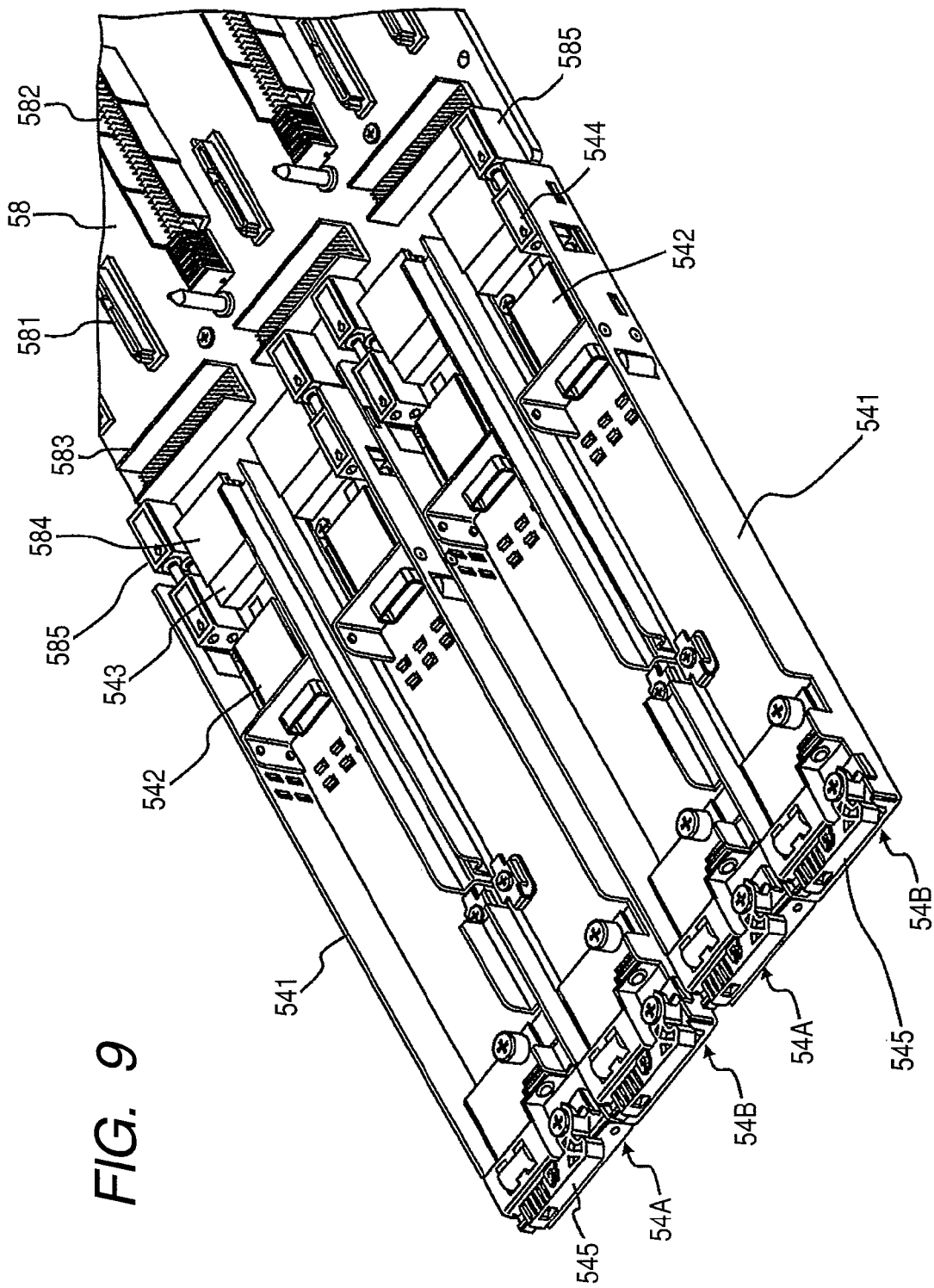
FIG. 9 is an enlarged perspective view of the cable holder.

FIG. 9 is a perspective view of the cable holders 54A and 54B in one sub storage unit 50. The cable holders 54A and 54B are each configured to include a rectangular case 541 with an open upper surface, a connector 542 provided at the tip end side of the case 541, another connector 543 electrically coupled to the connector 542, a guide section 544 provided adjacent to the connector 543, and the lever 545 provided at the base end side of the case 541 to be able to rotate, for example.

The connector 542 is inserted with, for attachment, the tip end side of the communications cable 70. The connector 542 and another connector 543 are electrically coupled together by a wiring pattern not shown. Through coupling between the connector 543 and the connector 584 on the printed wiring board 58, the communications cable 70 and the enclosures 52 are electrically coupled together.

As shown in FIG. 9, the cable holder 54A for input use is shaped differently from the cable holder 54B for output use. When viewed from the rear, the protrusion-formed guide section 544 is provided on the left side of the cable holder 54A for input use, and on the right side of the cable holder 54B for output use. The cable holders 54A And 54B are each provided with, at the tip end side, the connector 543 at the position adjacent to the guide section 544.

As such, differences between the cable holder 54A for input use and the cable holder 54B for output use are the position of the guide section 544 and the position of the connector 543. This enables to prevent any possible erroneous attachment if the cable holder 54B for output use is inserted where the cable holder 54A for input use is supposed to be inserted, and vice versa. This is because if the cable holders 54A and 54B are erroneously attached, the user may notice his or her attachment error because the cable holders are not correctly attached.

On the other hand, when the cable holders 54A and 54B are inserted into the case 41 from their predetermined positions, the protrusions of the guide sections 544 are coupled to the holes of a guide sections 585 so that the cable holders 54A and 54B are fixed in position. When the guide sections 544 and 585 are mechanically coupled, the connector 543 is attached to the connector 584 so that the communications cables 70 and the enclosures 52 are electrically coupled.

By referring to FIGS. 9 and 10, described next is the configuration of the printed wiring board 58. The printed wiring board 58 is provided with, on the rear end side, a plurality of guide sections 585 respectively corresponding to the guide sections 544. These guide sections 585 are respectively formed with holes corresponding to the protrusions of the guide sections 544.

The rear end side of the printed wiring board 58 is provided with the connector 584 adjacent to the guide section 585 and corresponding to the connector 543. The connector 584 is coupled to the enclosure 52 via a printed wiring pattern 587 (refer to FIG. 13) of the printed wiring board 58.

Figure 10:
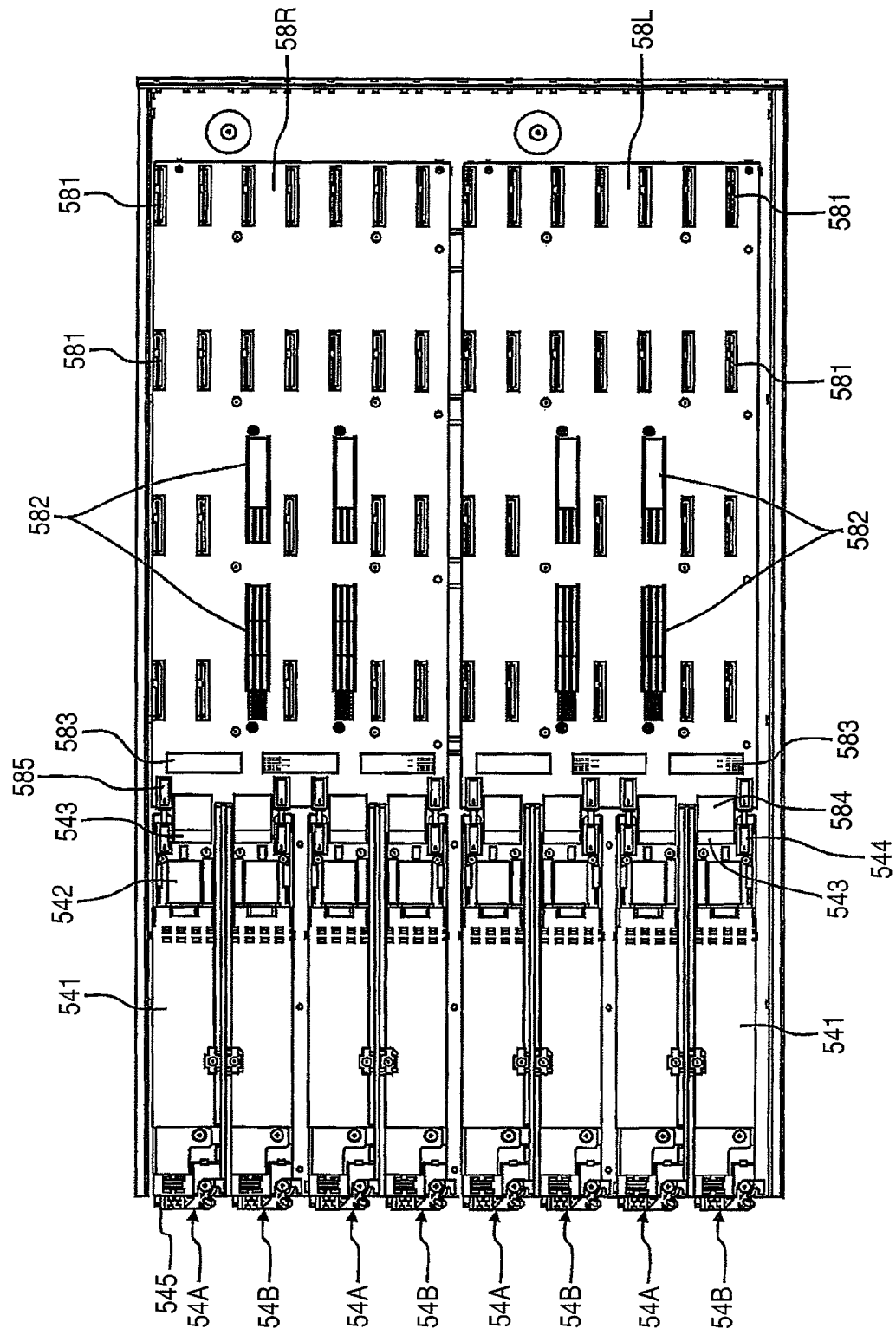
FIG. 10 is a plan view showing the relationship and others between a printed wiring board and the cable holder.

As is shown also in the plane view of FIG. 10, the printed wiring board 58 is provided with connectors 581 to 583. The connector 581 is of drive use for attachment of the hard disk drives 51, and the connector 582 is of enclosure use for attachment of the enclosures 52. The connector 583 is for attachment of a power-supply attachment substrate 59 (refer to FIGS. 14A and 14B).

The drive-use connector 581 and the enclosure-use connector 582 are provided to be parallel to each other in the vertical direction of FIG. 10, and the connector 583 corresponding to the power supply device 55 is provided in the lateral direction of FIG. 10. In other words, the drive-use connector 581 and the enclosure-use connector 582 are provided parallel to each other in the longitudinal direction of the printed wiring board 58, and the connector 583 corresponding to the power supply device 55 is provided to be parallel to the short side of the printed wiring board 58 in such a manner as to be orthogonal to the direction along which the connectors 581 and 582 are provided.

Figure 11:
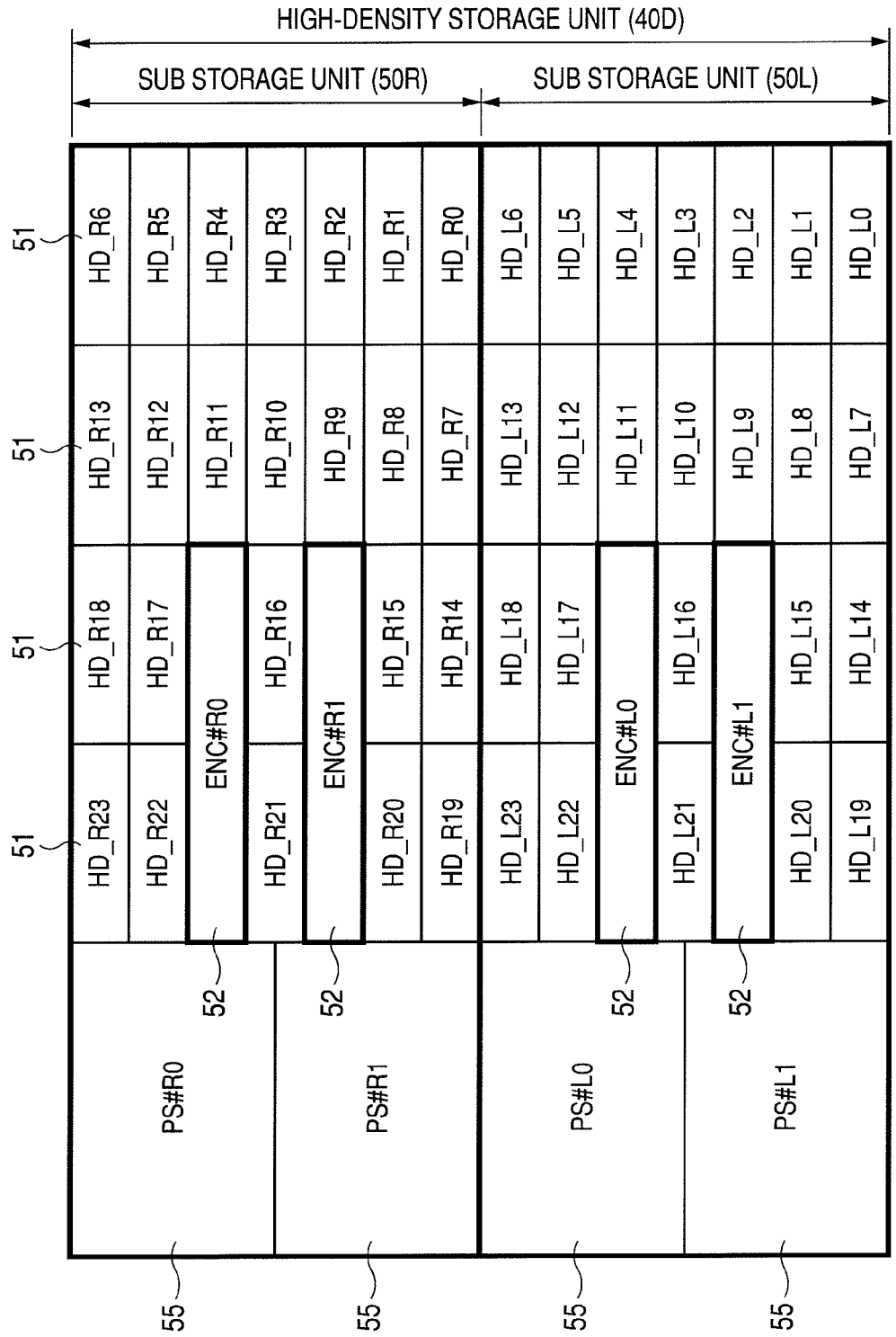
FIG. 11 is a diagram illustrating the state of accommodation of the hard disk drives and enclosures in the storage unit.

FIG. 11 is a diagram showing the case 41 viewed from above with the cover removed therefrom. The case 41 of the high-density storage unit 40D carries therein, in the lateral direction, sub storage units 50L and 50R.

On the left side viewed from the side of the front surface 43 (refer to FIG. 3), the left-side sub storage unit 50L is provided, and on the right side viewed from the side of the front surface 43, the right-side sub storage unit 50R is provided. That is, the sub storage units 50L and 50R are provided to be laterally symmetrical as if the case 41 being divided into two in the width direction thereof. Note that, in the below, When no specific distinction is needed between the sub storage units 50L and 50R, those are collectively referred to as sub storage units 50.

The upper side of FIG. 11 is the front side of the high-density storage unit 40D, and includes a plurality of hard disk drives 51. The under side of FIG. 11 is the rear side of the high-density storage unit 40D, and includes a plurality of power supply devices 55.

Described below is mainly the sub storage unit 50L on the left side. In the sub storage unit 50L, the hard disk drives 51 are each provided with an identification number. The identification number is so set as to be larger toward the right side from the left side of the sub storage unit 50L.

The sub storage unit 50L is provided with the hard disk drives 51 in four rows in total from the front to the rear side thereof. The first row is configured by the seven hard disk drives 51 from L#0 to L#6, and the second row is configured by the seven hard disk drives 51 from L#7 to L#13. The third row is configured by the five hard disk drives 51 from L#14 to L#18, and the fourth row is configured by the five hard disk drives 51 from L#19 to L#23.

In the third and fourth rows, the enclosures 52 (L#0) and 52 (L#1) are provided among the hard disk drives 51. To be specific, the enclosure 52 (L#1) is provided between the hard disk drives 51 (L#15) and 51 (L#16), and the hard disk drives 51 (L#20) and 51 (L#21). Similarly, the enclosure 52 (L#0) is provided between the hard disk drives 51 (L#16) and 51 (L#17), and the hard disk drives 51 (L#21) and 51 (L#22).

With the enclosures 52 provided as such to the third and fourth rows, the hard disk drives in the third row and those in the fourth row are fewer in number by two than those in the first and second rows.

If the enclosures 52 can be provided respectively to the first and second rows, the hard disk drives in the first row and those in the second row will be fewer in number by two than those in the third and fourth rows. If this is the configuration, however, the distance will be too long from the rear surface of the case 41 to the enclosures 52. As described by referring to FIG. 7, the cables 70 are inserted, with being respectively attached to the cable holders 54, from the lower rear side of the case 41 into the case 41, thereby being coupled to the enclosures 52. Accordingly, the enclosures 52 are preferably disposed on the rear side of the case 41 as close as possible.

On the other hand, as shown in FIG. 7, the power supply devices 55 are disposed at the far rear side of the case 41 to be able to be extracted from the rear side of the case 41. As such, the enclosures 52 are located forward than the power supply devices 55, and are disposed substantially at the center portion of the case 41. Considering the relationship with the array of the hard disk drives 51, the enclosures 52 are disposed in the array of the hard disk drives 51 in the rear rows, i.e., third and fourth rows.

The left-side sub storage unit 50L is configured as such. The right-side sub storage unit 50R is considered similarly to the left-side sub storage unit 50L, and thus is not described. In the description above, the configuration of the right-side sub storage unit 50R can be described if the reference characters "L#" is replaced with "R#".

Figure 12:
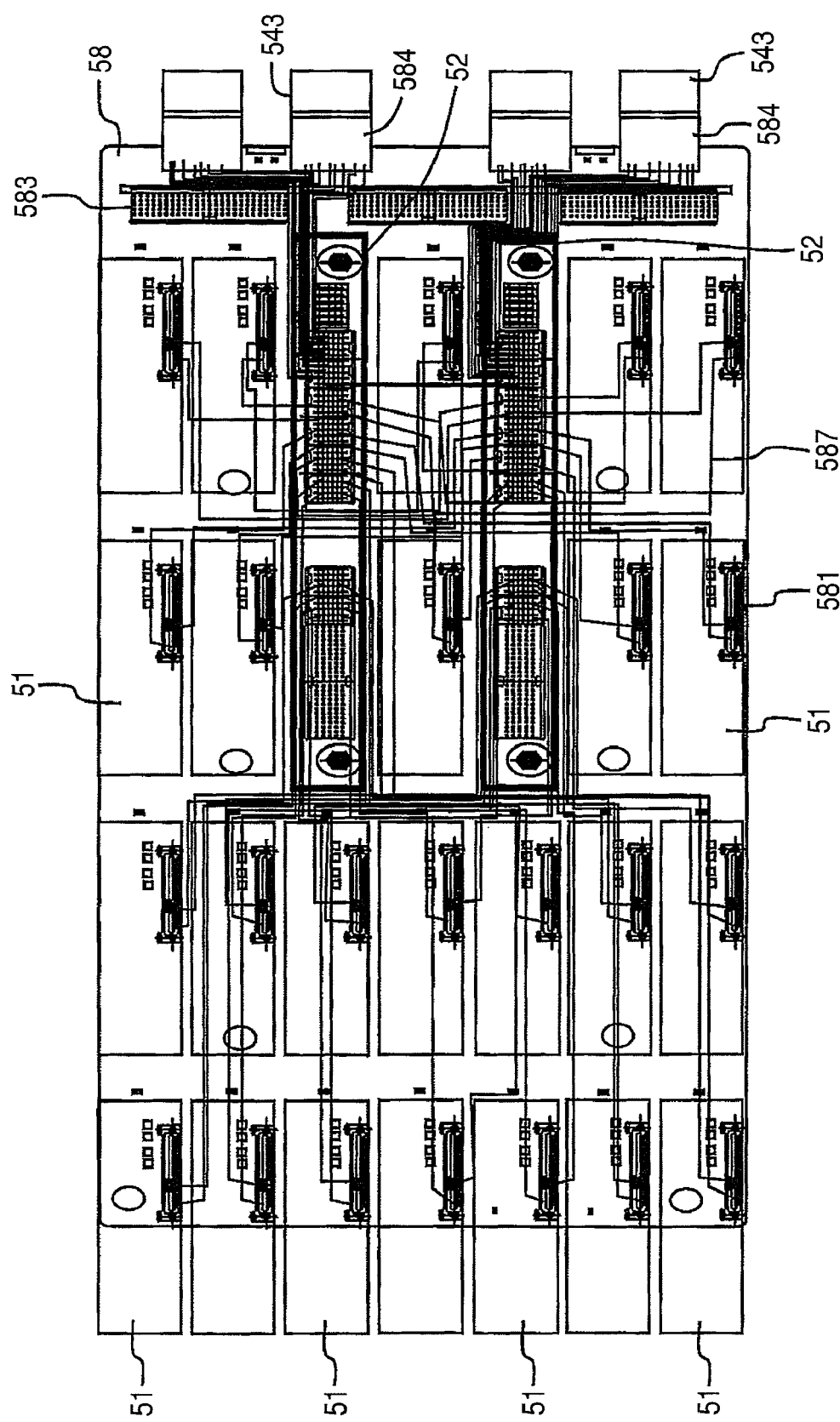
FIG. 12 is a diagram illustrating the relationship between connectors and a printed wiring pattern.
Figure 13:
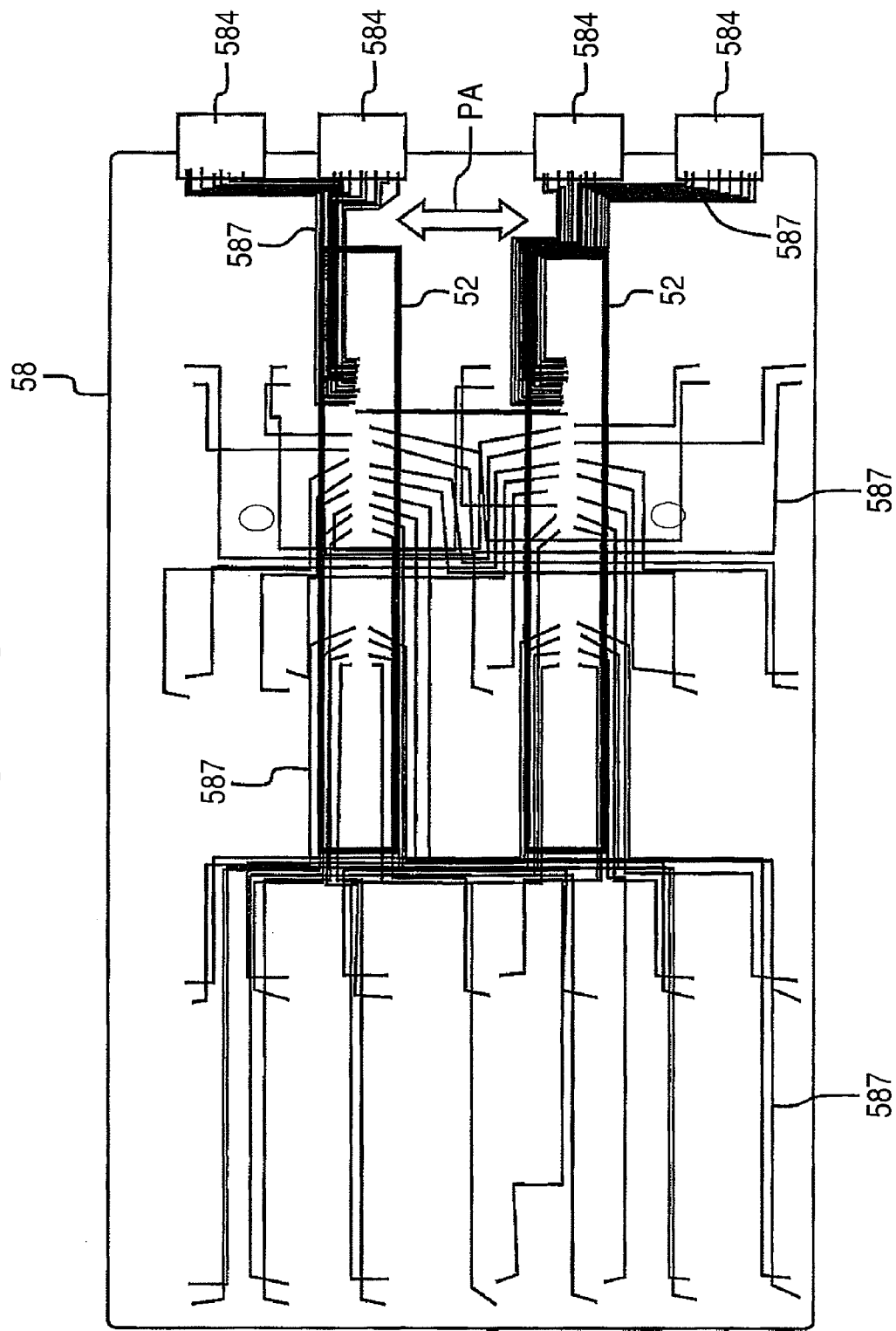
FIG. 13 is a diagram illustrating the state of formation of the printed wiring pattern.
Figure 14:
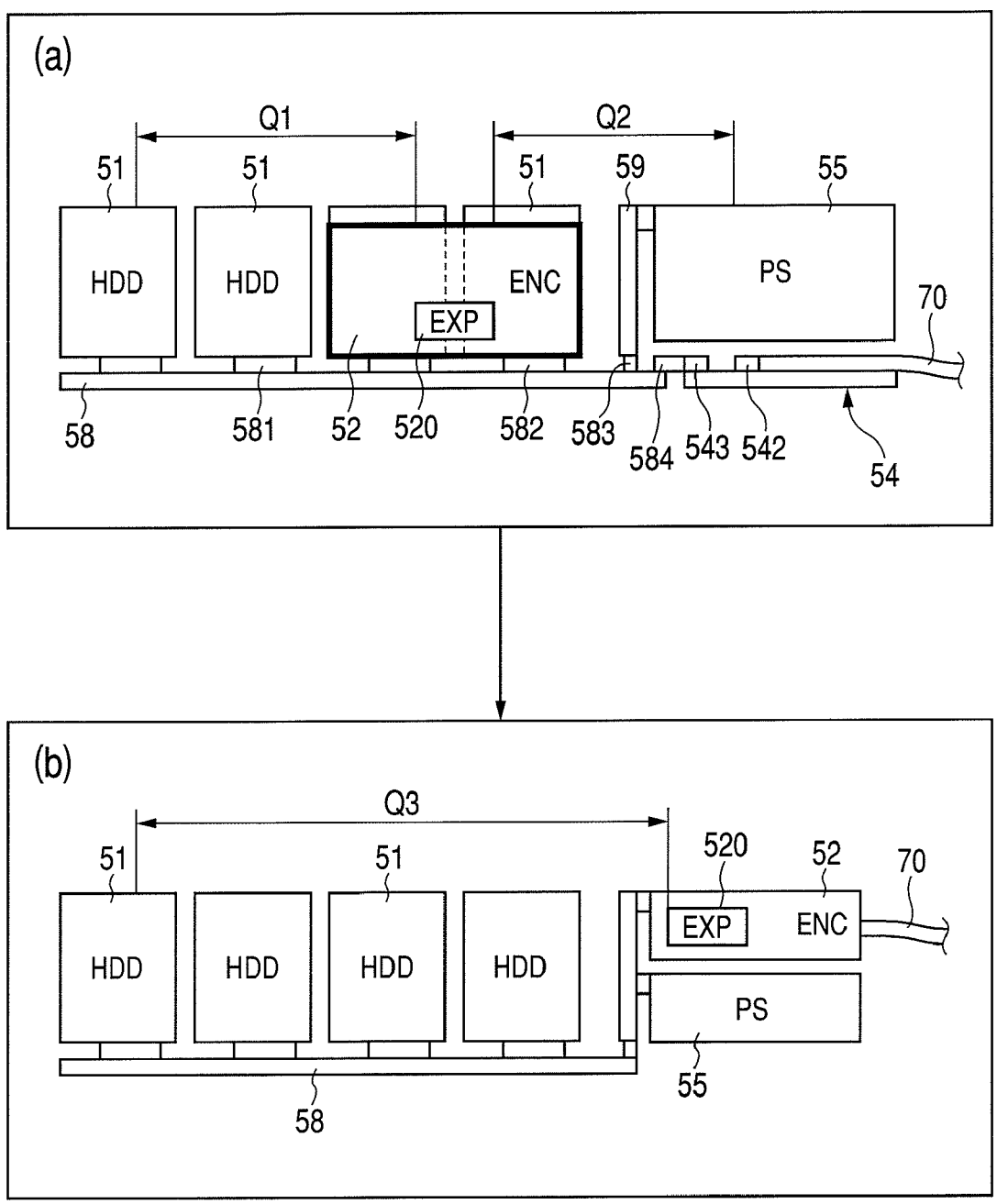
FIG. 14A is a diagram illustrating the layout of the enclosure and the cable holder viewed from the side.
FIG. 14B is a diagram for a comparison use.

FIG. 12 is a diagram showing the relationship between the components formed on the printed wiring board 58, i.e., the printed wiring pattern 587, the hard disk drives 51, and the enclosures 52. FIG. 13 is a diagram specifically showing the printed wiring board 587 with an emphasis of the shape thereof. In order to provide a clear understanding, FIG. 13 shows the positions of the enclosures 52 by thick solid lines.

In a region PA between the enclosures 52, two of the printed wiring patterns 587 are provided, i.e., one is directed from one of the enclosures 52 to each of the hard disk drives 51, and the other is directed from the remaining of the enclosures 52 to each of the hard disk drives 51. For ensuring redundancy, the enclosures 52 are each coupled to each of the hard disk drives 51. As such, the region PA is provided with a larger number of printed wiring patterns at high densities. As such, in this example, for ensuring the area of the region PA, the width of the region PA is increased by disposing the hard disk drive 51 between the enclosures 52. If the enclosures 52 are disposed adjacent to each other, and if no hard disk drive 51 is disposed between the enclosures 52, the width of the region PA is reduced, thereby resulting in a difficulty in forming a large number of printed wiring patterns.

FIGS. 14A and 14B are each a diagram illustrating the positional relationship among the enclosure 52, the power supply device 55, and the cable holder 54 viewed from the side of the high-density storage unit 40D. As shown in FIG. 14A, the enclosure 52 is disposed between the hard disk drives 51. The communications cable 70 is coupled to the printed wiring board 58 via the cable holder 54.

In the enclosure 52, a first distance Q1 between an expander 520 (refer to FIG. 16) and any of the hard disk drives 51 farthest therefrom is so set as to be equal to or smaller than a predetermined first upper limit value Th1. A second distance Q2 between the connector 542 attached with the communications cable 70 and the expander 520 is so set as to be equal to or smaller than a predetermined second upper limit Th2.

For keeping the signal quality of SAS capable of communications at the speed of 3 Gbps, for example, if requirements include the amplitude of 375 mV or more, and the jitter of 11 ps or smaller, the first upper limit value Th1 is set to 400 mm, and the second upper value Th2 to 280 mm. When the first distance Q1 is equal to or smaller than the first upper limit value Th1 (Q1≦Th1), and when the second distance Q2 is equal to or smaller than the second upper limit value Th2 (Q2≦Th2), a fixed level of quality can be achieved for the signals with no need for using any device for signal reproduction and relay such as SAS buffer.

FIG. 14B shows a case where the hard disk drives 51 and the enclosures 52 are separately provided to the printed wiring board 58. FIG. 14B shows a virtual comparison example, and is not showing a previous technology. With the configuration of FIG. 14B, in the enclosure 52, a distance Q3 between the expander 520 and any of the hard disk drives 51 farthest therefrom exceeds the first upper limit value Th1, whereby the SAS signals are resultantly reduced in quality.

In order to reduce the distance Q3, the number of the rows of the hard disk drives 51 may be reduced to two, for example. If this is the case, however, the number of the hard disk drives 51 to be provided to the storage unit 40 is reduced, and thus the storage capacity of the storage unit 40 is reduced.

As an alternative possibility, any device for reproduction of SAS signals may be additionally provided. If this is the case, however, adding such a device increases the manufacturing cost. Adding such a device also increases the number of components, and thus reduces the reliability of the resulting storage unit because the possibility of component failure is increased. On the other hand, in this example, the configuration of FIG. 14A is adopted so that the signal quality can be retained without using any special device.

Figure 15:
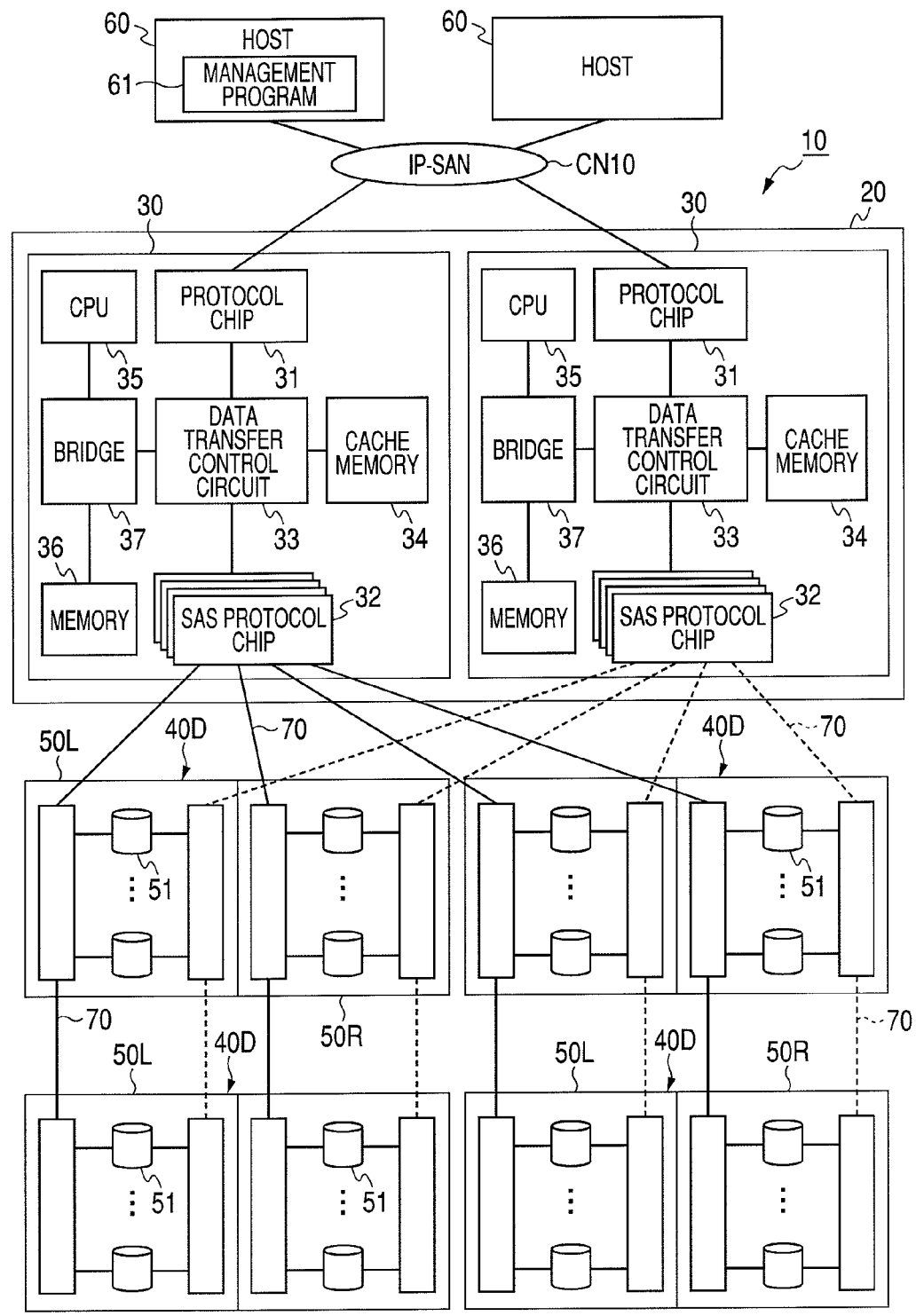
FIG. 15 is a configuration diagram of a system including the storage control apparatus.

Described next are the configuration or others of the storage control apparatus 10. FIG. 15 is a diagram showing the entire configuration of an information processing system including the storage control apparatus 10. A host 60 is a computer device such as server computer, main frame computer, work station, and personal computer.

The storage control device 10 can be coupled to a plurality of hosts 60 over the communications network CN10. Any one or more of the hosts 60 can be provided with a management program 61 for management use of the storage control apparatus 10. Using the management program 61, a user issues commands to the storage control apparatus 10, or receives notifications therefrom, for example. The communications network CN10 is configured as FC_SAN (Fibre Channel_Storage Area Network) or IP_SAN (Internet Protocol_SAN).

The control unit 20 is provided with a plurality of controllers 30. The controllers 30 are of the same configuration, and operate separately. The controllers 30 are each coupled to the storage units 40 with various paths. With such a configuration, even if any of the controllers 30 stops in operation due to failure, the remaining controller(s) 30 can perform data reading and writing through access to any desired hard disk drive 51.

The controllers 30 are each configured to include the protocol chip 31, the SAS protocol chip 32, a data transfer control circuit 33, a cache memory 34, the CPU (Central Processing Unit) 35, the memory 36, and a bridge 37.

The protocol chip 31 is a communications control circuit for communications with the hosts 60. The SAS protocol chip 32 is a communications control circuit for communications with a normal storage unit 40N, and a sub storage units 50 (with the high-density storage unit 40D). The SAS protocol chip 32 can be plurally provided. In this example, described is a case where four of the SAS protocol chips 32 are provided.

The data transfer control circuit 33 is provided for control over data transfer. The data transfer control circuit 33 is coupled to the various components, i.e., the protocol chip 31, the SAS protocol chip 32, the cache memory 34, the CPU 35, and the memory 36.

The data transfer control circuit 33 serves to transfer data provided by the hosts 60 via the protocol chip 31 to the cache memory 34, and transfer data stored in the cache memory 34 to the SAS protocol chip 32, for example. The data transfer control circuit 33 also serves to transfer data provided by the hard disk drives 51 via the SAS protocol chip 32 to the cache memory 34, and transfer data stored in the cache memory 34 to the protocol chip 32, for example.

The CPU 35 serves to control the operation of the controllers 30. The memory 36 stores therein computer programs, management data, and others. The CPU 35 and the memory 36 are both coupled to the data transfer control circuit 33 or others via the bridge 37.

Figure 16:
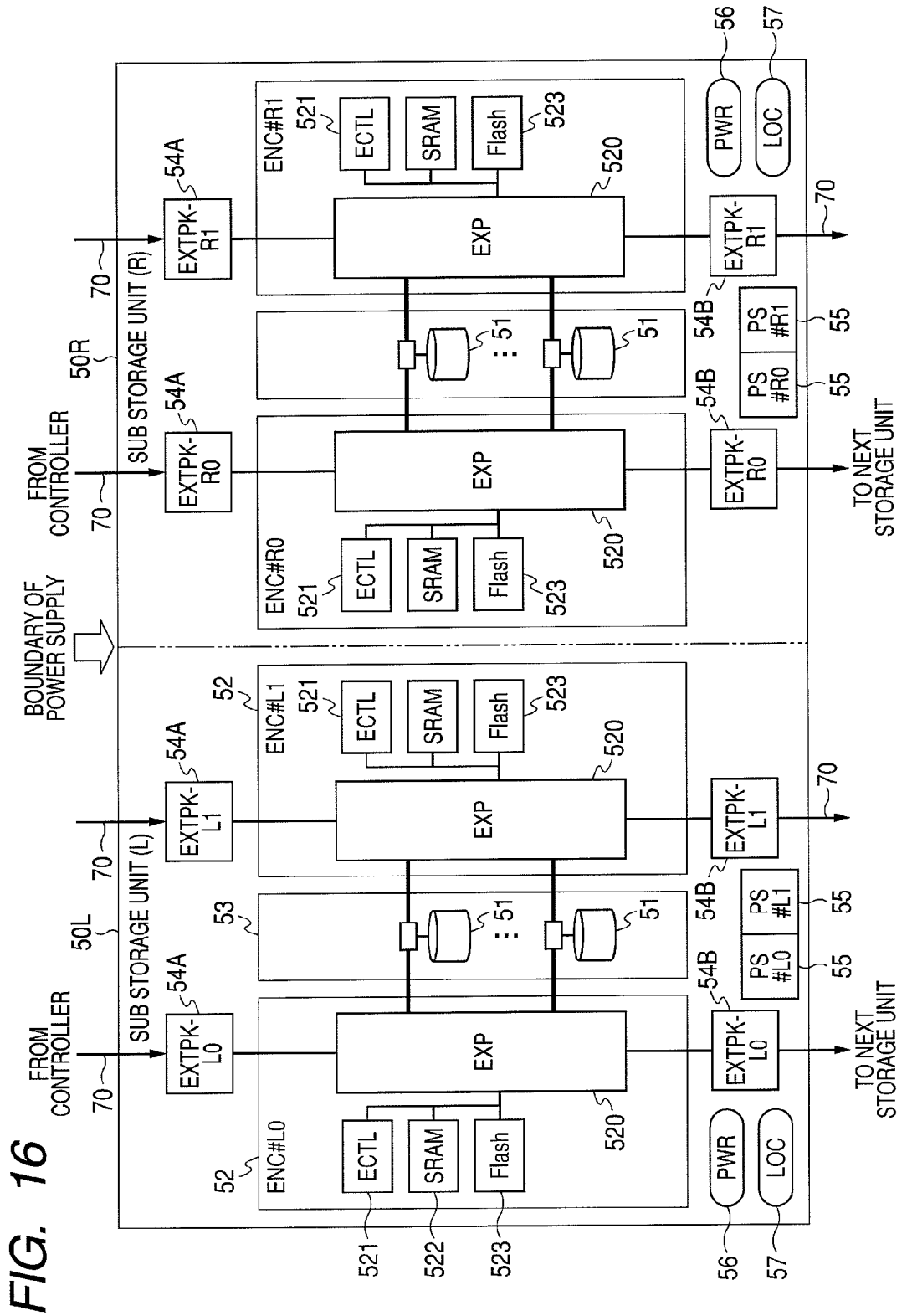
FIG. 16 is a block diagram showing the configuration of sub storage units.

FIG. 16 is a block diagram showing the configuration of the high-density storage unit 40D. As described in the foregoing, the high-density storage unit 40D is provided with a plurality of sub storage units 50L and 50R. The sub storage units 50L and 50R are of the same configuration, and can operate each separately.

Described now is mainly the sub storage unit 50L on the left side. The sub storage unit 50L is configured to include the 24 hard disk drives 51, the two enclosures 52, one backboard 53, the two cable holders 54A for signal input use, the two cable holders 54B for signal output use, the two power supply devices 55, one power supply lamp 56, and one position display lamp 57, for example.

The enclosures 52 control the communications with the hard disk drives 51. The enclosures 52 are each configured to include the expander 520, an environmental controller 521, a memory 522, and a flash memory 523. Both of the enclosures 52, i.e., the enclosures 52 (#L0) and (#L1) are accessible to the hard disk drives 51.

The expander 520 is a circuit for coupling with each of the 24 hard disk drives 51. The expander 520 is coupled with the cable holder 54A for signal input use, and the cable holder 54B for signal output use. The hard disk drives 51 are each coupled to the expander 520 of each of the enclosures 52 via the backboard 53. Commands coming from the controllers 30 are transmitted to any of the enclosures 52 coupled with any desired hard disk drive 51 via the cable 70 or others for processing.

In the drawing, the environmental controller 521 denoted by "ECTL" serves to control the environment. Also in the drawing, the memory 522 denoted by "SRAM" serves to store therein data on a temporary basis. In the drawing, the flash memory 523 denoted by "Flash" serves to store therein manufacturing numbers, SAS addresses, and others.

The power supply devices 55 each serve to provide power to the enclosures 52, the lamps 56 and 57, and others. Even if any one of the power supply devices 55 becomes out of order due to failure, the remaining power supply device(s) 55 can make a power supply.

The power supply lamp 56 and the position display lamp 57 are both provided on the front surface 43 (refer to FIG. 3) of the high-density storage unit 40D corresponding to the sub storage units 50L and 50R. The power supply lamp 56 indicates the state of power supply to the sub storage unit 50. If with a power supply, the power supply lamp 56 is illuminated. The position display lamp 57 is for notifying a user of the position of the sub storage unit 50. When a user designates any of the sub storage units 50 using the management program 61 of the host 60, the position display lamp 57 corresponding to thus designated sub storage unit 50 is illuminated.

The right-side sub storage unit 50R is configured similarly to the left-side sub storage unit 50L, and thus is not described. With the normal storage unit 40N, the sub storage unit 50 is not provided, and thus the power supply lamp 56 and the position display lamp 57 are provided one each. The normal storage unit 40N can be provided with the hard disk drives 51 fewer in number than those of the high-density storage unit 40D (48), e.g., 15 or 24.

FIG. 17 is a diagram illustrating a storage unit management table T10 for management use of the storage unit 40. This management table T10 can be stored inside of the memory 36 of each of the controllers 30.

The management table T10 includes fields of "unit number C10", "SAS address C11", "manufacturing number C12", "paired number C13", "sub storage unit type C14", and "effective flag C15".

The field of "unit number C10" stores sequential numbers for use to discriminate the storage units in the table T10. The field of "SAS address C11" stores an SAS address set to each of the storage units 40. The field of "manufacturing number C12" stores a manufacturing number set to each of the storage units 40.

The field of "paired number C13" stores a paired number for use to discriminate any detected pair. The pair means the pair of the sub storage units 50L and 50R belonging to any same high-density storage unit 40D. The controllers 30 of each of the control units 20 each acquire the manufacturing number from each of the storage units 40 (including the sub storage units 50), and determine any units under the same manufacturing number as a pair for management.

The sub storage units 50L and 50R are under the same manufacturing number. As such, any plurality of units forwarding any same manufacturing number back to the controllers 30 is determined as being a pair of the sub storage units 50L and 50R provided to the same high-density storage unit 40D. The controller 30 assigns a sequential paired number to each of the pairs of the sub storage units 50L and 50R in the order of finding.

The field of "effective flag C15" stores values each indicating whether the contents registered in the management table T10 are correct or not under any predetermined rules. As to the predetermined rules, firstly, if with the high-density storage unit 40D, the manufacturing number can be acquired each from the sub storage units 50L and 50R, secondly, the units numbers are sequential, thirdly, the units numbers are sequential for the sub storage units 50L and 50D in any same high-density storage unit 40D, and fourthly, the right-side sub storage unit 50R is coupled after the coupling of the left-side sub storage unit 50L (for coupling of the high-density storage unit 40D, first of all, the left-side sub storage unit 50L is coupled).

When the contents of any one line in the table T10 are correct, the field of "effective flag C15" stores data indicating that the contents are effective, e.g., OK. When the contents of the line are not under the rules, the field of "effective flag C15" stores data indicating that the contents are not effective, e.g., NG.

Figure 18:
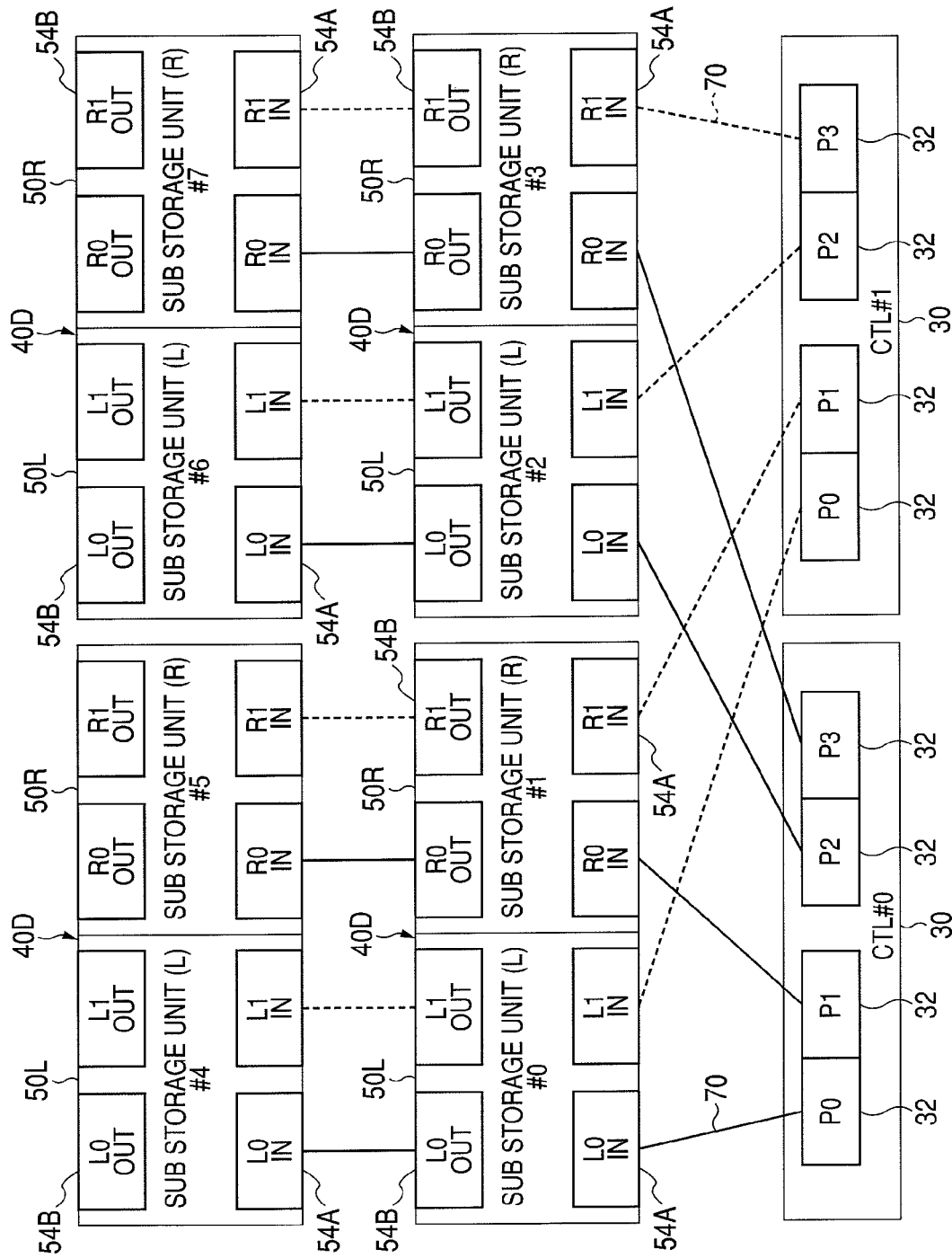
FIG. 18 is a diagram illustrating the state of coupling of the storage unit.

FIG. 18 is a diagram illustrating the form of coupling of the high-density storage units 40D. The controllers 30 in this example are each provided with four of the SAS protocol chips 32. In FIG. 18, in each of the SAS protocol chips 32, reference characters of P0 to P3 are provided to their communications paths for discrimination.

As shown in FIG. 18, the sub storage units 50 in each of the high-density storage units 40D are daisy-chained, and the sub storage units 50 are each provided with two access paths. One of the access paths is of 0-type (#0 type), and the other access path is of 1-type (#1). The 0-type path is accessed by one of the controllers 30 (#0), and the 1-type path is accessed by any of the remaining controllers 30 (#1).

The SAS protocol chips 32 are each coupled with the sub storage unit 50 in such a manner that the SAS protocol chips 32 become uniform in load, i.e., the four communications paths are used substantially uniformly.

The sub storage units 50 are each assigned a unit number (#0 to #7) in order of coupling to the controllers 30. As to the frequency of use of the sub storage units 50, a lower unit number means a higher frequency of use. As such, the sub storage units 50 are coupled to the controllers 30 in order of P0 to P3 to achieve the substantially uniform use of the SAS protocol chips 32.

To be specific, first of all, the communications port P0 is coupled with the sub storage unit 50 (#0), the communications port P1 is coupled with the sub storage unit 50 (#1), the communications port P2 is coupled with the sub storage unit 50 (#2), and the communications port P3 is coupled with the sub storage unit 50 (#3). Through such coupling, the communications ports (communications paths) are each coupled with the sub storage unit 50. In the below, similarly, the communications ports are each coupled with the sub storage unit 50 in a sequential manner. This accordingly enables to make the frequency of use substantially uniform for the communications ports, thereby favorably achieving load sharing.

Figure 19:
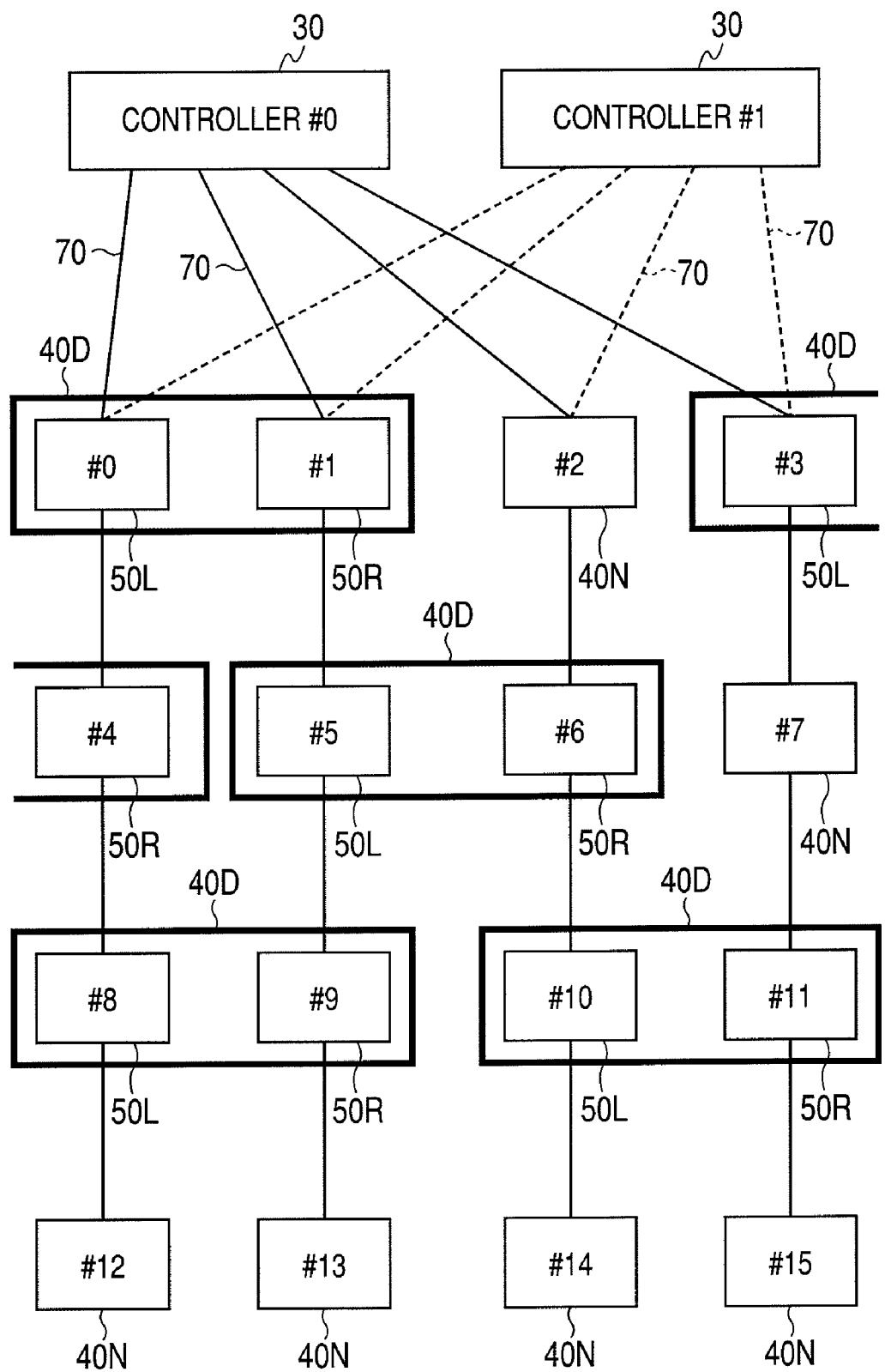
FIG. 19 is a diagram illustrating the state in which storage units of a normal type and the storage units of the invention are used together.

FIG. 19 is a diagram showing the state in which the normal storage units 40N and the high-density storage units 40D are used together. Described mainly above is the high-density storage unit 40D, but in this example, the normal storage unit 40N can be used at the same time with the high-density storage unit 40D. FIG. 19 schematically shows, not in view of load sharing, the state in which the high-density storage units 40D and 40N varying in type are used together.

As shown in FIG. 19, the normal storage unit 40N (#2) is provided adjacent to the high-density storage unit 40D including the sub storage units 50L (#0) and 50R (#1). Next to the normal storage unit 40N (#2), provided is the high-density storage unit 40D including the sub storage units 50L (#3) and 50R (#4). Next to such a configuration, provided is the high-density storage unit 40D including the sub storage units 50L (#5) and 50R (#6).

Figure 20:
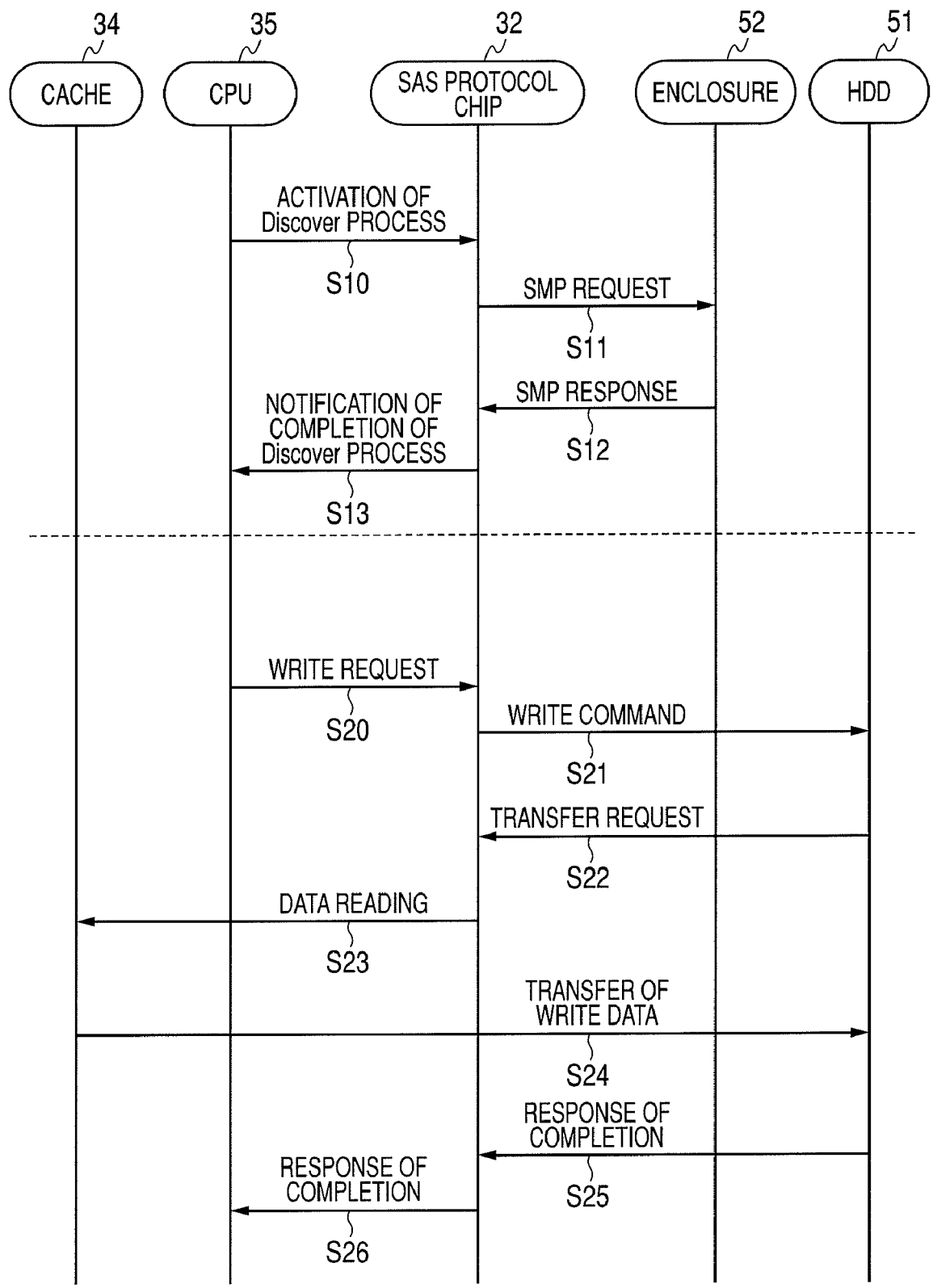
FIG. 20 is a flowchart of a process of data writing from a controller to the hard disk drive.

FIG. 20 is a flowchart of a write process. Prior to execution of the write process, the CPU 35 activates a discover process (S10). The discover process is executed to detect the storage units 40 (including the sub storage units 50) coupled to the controllers 30, and register the detection results into the management table T10.

The discover process is now simply described. The SAS protocol chip 32 issues an SMP (Simple Message Protocol) request to the enclosure 52 in response to a command coming from the CPU 35 (S11). The enclosure 52 responds to the SMP request (S12). After receiving the SMP response from the coupled enclosure 52, when acknowledging the existence of the storage units 40N and the sub storage units 50, the SAS protocol chip 32 notifies completion of the discover process to the CPU 35 (S13). The CPU 35 then registers the detection results, i.e., the detected storage units 40N and sub storage units 50, into the management table T10 in order of detection.

Described now is a write process. Upon reception of a write command from the host 60, the CPU 35 of the controller 30 is to be ready for accepting the write data. The CPU 35 then stores the write data provided by the host 60 into the cache memory 34.

The CPU 35 starts a destaging process at any predetermined timing. The destaging process is executed to write the write data stored in the cache memory 34 into the hard disk drives 51. If with a synchronous type, after completion of the destaging process, the CPU 35 notifies completion of processing of the write command to the host 60. If with an asynchronous type, after the write data from the host 60 is stored in the cache memory 34, the CPU 35 notifies completion of processing of the write command to the host 60. There is no restriction between the synchronous type and the asynchronous type.

When the destaging process is started, the CPU 35 issues a write request to the SAS protocol chip 32 (S20). Upon reception of the request from the CPU 35, the SAS protocol chip 32 issues a write command to any predetermined hard disk drive 51 (S21). This write command is transferred to the predetermined hard disk drive 51 via the expander 520 or others. The predetermined hard disk drive 51 herein is the one having a storage area for writing of the write data.

Upon reception of the write command from the CPU 35, the hard disk drive 51 asks the SAS protocol chip 32 for transfer of the write data (S22). The SAS protocol chip 32 then reads the write data from the cache memory 34 (S23), and transfers the data to the hard disk drive 51 (S24).

The hard disk drive 51 then writes the write data provided by the SAS protocol chip 32 into a magnetic disk, and notifies completion of the writing as such to the SAS protocol chip 32 (S25). Upon reception of such a notification, the SAS protocol chip 32 notifies completion of the writing to the hard disk drive 51 to the CPU 35 (S26). With such processes of S20 to S26, the destaging process is completed.

Figure 21:
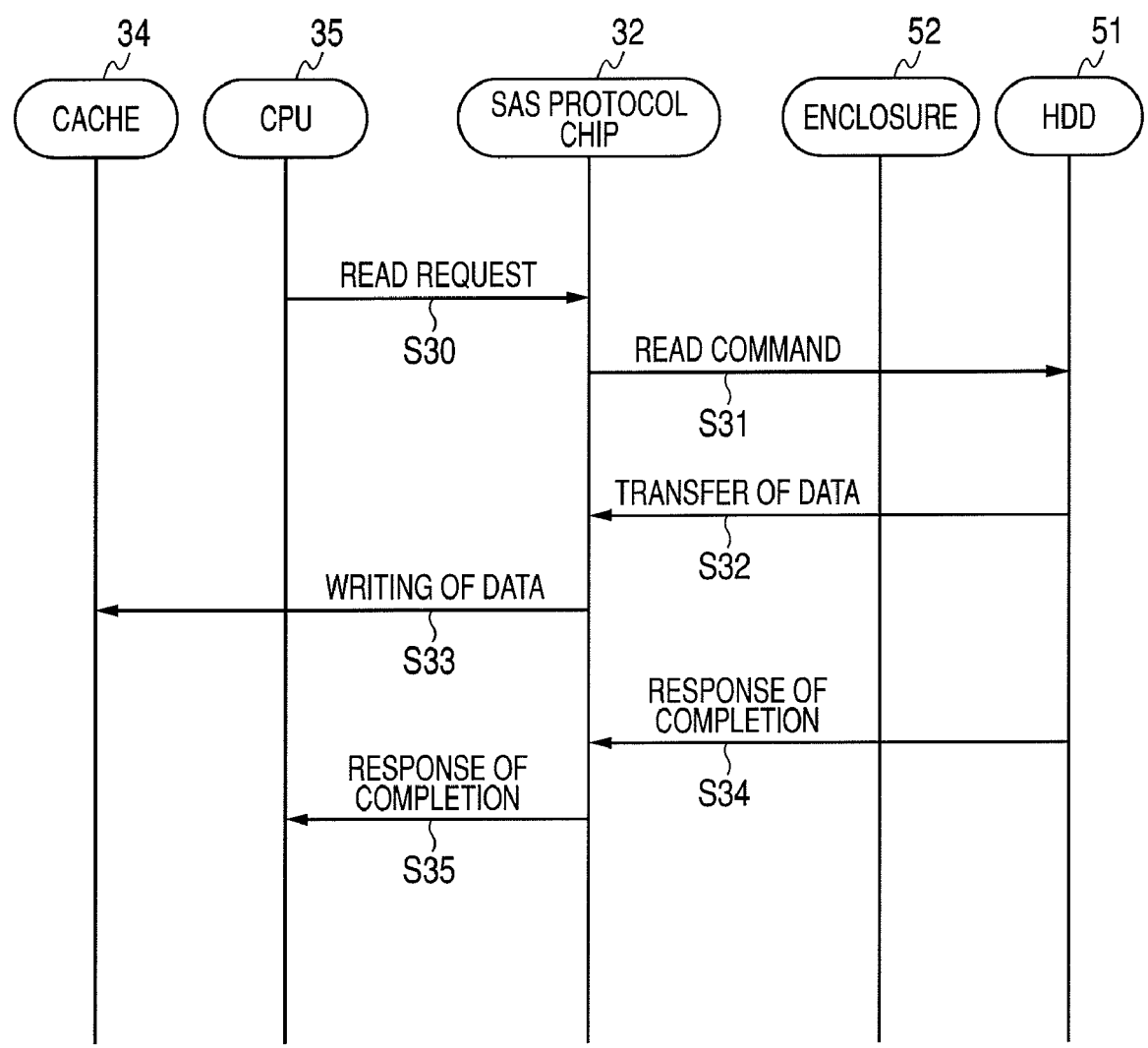
FIG. 21 is a flowchart of a process of data reading by the controller from the hard disk drive.

FIG. 21 is a flowchart of the read process. The host 60 issues a read command to the controller 30. The read command includes a logical address of a reading destination and the data size.

Upon reception of the read command, the CPU 35 asks the SAS protocol chip 32 for reading of data (S30). The SAS protocol chip 32 issues a read command to any of the hard disk drives 51 storing data for reading (S31). The read command is directed to the hard disk drive 51 via the expander 520 or others.

Upon reception of the read command, the hard disk drive 51 transfers the requested data to the SAS protocol chip 32 (S32). The SAS protocol chip 32 transfers the data provided by the hard disk drive 51 to the cache memory 34 for storage therein (S33). After receiving a notification of completion of processing of the read command from the hard disk drive 51, the SAS protocol chip 32 notifies completion of the data reading to the CPU 35 (S35).

As described above, the high-density storage unit 40D of this example is provided with the sub storage units 50L and 50R operating each separately. Accordingly, the placement size of the storage control apparatus 10 can be reduced, and the storage capacity of the storage control apparatus 10 can be increased, thereby favorably being able to cut the operating cost and others.

In this embodiment, the enclosures 52 are provided in the array of the hard disk drives 51 so that the distance can be reduced between each of the hard disk drives 51 and the enclosures 52. Moreover, the communications cable 70 is coupled to the printed wiring board 58 using the cable holder 54 to be inserted into the space below the power supply device 55 so that the distance between the coupling position of the communications cable 70 and the enclosures 52 can be reduced. As such, in this embodiment, in the high-density storage unit 40D, there is no need to use any special device for signal reproduction to achieve a predetermined level of signal quality. Accordingly, the reliability can be successfully increased without increasing the cost that much.

While the invention has been described in detail, the foregoing description is in all aspects illustrative and not restrictive. It is understood that those skilled in the art can devise numerous other modifications and variations without departing from the scope of the invention.

What is claimed is:
1. A storage control apparatus, comprising:
 a control device; and
 a storage unit to be controlled by the control device, wherein the storage unit includes:
  a chassis; and a plurality of sub storage units that are provided in the chassis, and operate each independently, and the sub storage units each include:
- a printed wiring board;
- a plurality of storage devices to be attached to the printed wiring board;
- at least one or more unit control devices provided at a predetermined position(s) between the storage devices for taking charge of communications between the storage devices and the control device;
- at least one or more power supply devices attached to the printed wiring board for making a power supply to each of the plurality of storage devices and the at least one or more unit control devices; and
- at least one or more cable attachment devices each detachably attached to the printed wiring board with a communication cable detachably attached thereto for a coupling between the control device and the at least one or more unit control devices.

2. The storage control apparatus according to claim 1, wherein
the predetermined position(s) are each set to have a first distance of a predetermined first upper limit value or smaller for between the at least one or more unit control devices and each of the plurality of storage devices, and a second distance of a predetermined second upper limit value or smaller for between the at least one or more unit control devices and the one or more cable attachment devices.

3. The storage control apparatus according to claim 1 or 2, wherein
the at least one or more unit control devices are provided plurally on the printed wiring board, and at least one or more of the plurality of storage devices are provided each between the unit control devices.

4. The storage control apparatus according to claim 2, wherein
the first and second upper limit values are set to achieve signal transmission with a predetermined level of quality without using a device for signal relay.

5. The storage control apparatus according to claim 2, wherein
the at least one or more cable attachment devices are each inserted to be parallel to the printed wiring board from a space between the at least one or more power supply devices and the chassis, and are each electrically coupled to the printed wiring board.

6. The storage control apparatus according to claim 2, wherein the at least one or more cable attachment devices each include:
- a body that accommodates therein at least a part of the communications cable;
- an electrical coupling device provided at one end side of the body for establishing an electrical coupling between the printed wiring board and one end side of the communications cable; and
- a positioning coupling device provided to the one end side of the body for positioning through a mechanical coupling with the printed wiring board.

7. The storage control apparatus according to claim 6, wherein the electrical coupling device includes:
- a first connector to which the one end side of the communications cable is electrically coupled;
- a second connector to be electrically coupled to the printed wiring board; and
- a wiring device for establishing an electrical coupling between the first and second connectors.

8. The storage control apparatus according to claim 2, wherein the at least one or more cable attachment devices are each provided with:
- an input cable attachment device to be attached with an input communications cable for transmission of a signal provided to the at least one or more unit control devices; and
- an output cable attachment device to be attached with an output communications cable for transmission of a signal provided by the at least one or more unit control devices.

9. The storage control apparatus according to claim 2, wherein
the plurality of storage devices and the at least one or more unit control devices are detachably provided to be vertical to the printed wiring board,
the at least one or more power supply devices are detachably provided to be parallel to the printed wiring board via a first attachment board provided vertically to the printed wiring board, and
the cable attachment device is located at a space between the at least one or more power supply devices and the printed wiring board, and is detachably provided to be parallel to the printed wiring board.

10. The storage control apparatus according to claim 2, wherein one surface of the printed wiring board is provided thereon with a plurality of rows of the plurality of storage devices aligned in a first direction with a space in a second direction orthogonal to the first direction, and
the one or more unit control devices are provided to across any plurality of the rows on a side closer to the printed wiring board in the second direction, and the plurality of the storage devices are provided between a plurality of the at least one or more unit control devices.

11. The storage control apparatus according to claim 1, wherein
the at least one or more cable attachment devices are each inserted to be parallel to the printed wiring board from a space between the at least one or more power supply devices and the chassis, and are each electrically coupled to the printed wiring board.

12. The storage control apparatus according to claim 1, wherein
the at least one or more cable attachment devices each include:
- a body that accommodates therein at least a part of the communications cable;
- an electrical coupling device provided at one end side of the body for establishing an electrical coupling between the printed wiring board and one end side of the communications cable; and
- a positioning coupling device provided to the one end side of the body for positioning through a mechanical coupling with the printed wiring board.

13. The storage control apparatus according to claim 12, wherein
the electrical coupling device includes:
- a first connector to which the one end side of the communications cable is electrically coupled;
- a second connector to be electrically coupled to the printed wiring board; and
- a wiring device for establishing an electrical coupling between the first and second connectors.

14. The storage control apparatus according to claim 1, wherein
the at least one or more cable attachment devices are each provided with:

an input cable attachment device to be attached with an input communications cable for transmission of a signal provided to the at least one or more unit control devices; and an output cable attachment device to be attached with an output communications cable for transmission of a signal provided by the at least one or more unit control devices.

15. The storage control apparatus according to claim 1, wherein the plurality of storage devices and the at least one or more unit control devices are detachably provided to be vertical to the printed wiring board, the at least one or more power supply devices are detachably provided to be parallel to the printed wiring board via a first attachment board provided vertically to the printed wiring board, and the cable attachment device is located at a space between the at least one or more power supply devices and the printed wiring board, and is detachably provided to be parallel to the printed wiring board.

16. The storage control apparatus according to claim 1, wherein one surface of the printed wiring board is provided thereon with a plurality of rows of the plurality of storage devices aligned in a first direction with a space in a second direction orthogonal to the first direction, and the one or more unit control devices are provided to across any plurality of the rows on a side closer to the printed wiring board in the second direction, and the plurality of the storage devices are provided between a plurality of the at least one or more unit control devices.

* * * * *